US012632632B2

(12) United States Patent (10) Patent No.: US 12,632,632 B2
Greene et al. (45) Date of Patent: May 19, 2026

(54) METHOD AND APPARATUS FOR ESTIMATING SIGNAL RELATED DELAYS IN A PLD DESIGN

(71) Applicant: Microchip Technology Inc., Chandler, AZ (US)

(72) Inventors: Jonathan W. Greene, Palo Alto, CA (US); Gabriel Barajas, Mountain View, CA (US); Fei Li, San Jose, CA (US); Hassan Hassan, Waterloo (CA); James Sumit Tandon, Fremont, CA (US)

(73) Assignee: Microchip Technology Inc., Chandler, AZ (US)

( * ) Notice: Subject to any disclaimer, the term of this patent is extended or adjusted under 35 U.S.C. 154(b) by 1020 days.

(21) Appl. No.: 17/740,644

(22) Filed: May 10, 2022

(65) Prior Publication Data

US 2022/0382945 A1 Dec. 1, 2022

Related U.S. Application Data

(60) Provisional application No. 63/190,237, filed on May 18, 2021.

(51) Int. Cl.
G06F 30/347 (2020.01)
(52) U.S. Cl.
CPC ................................. G06F 30/347 (2020.01)
(58) Field of Classification Search
CPC .................................................... G06F 30/347
USPC ........................................................ 716/121
See application file for complete search history.

(56) References Cited

U.S. PATENT DOCUMENTS

| | | | |
|---|---|---|---|
| 4,873,459 A | 10/1989 | El Gamal et al. | |
| 4,910,417 A | 3/1990 | Gamal et al. | |
| 4,961,002 A | 10/1990 | Tam et al. | |
| 5,017,813 A | 5/1991 | Galbraith et al. | |
| 5,055,718 A | 10/1991 | Galbraith et al. | |
| 5,093,900 A | 3/1992 | Graf | |
| 5,095,228 A | 3/1992 | Galbraith et al. | |

(Continued)

FOREIGN PATENT DOCUMENTS

| | | |
|---|---|---|
| JP | 3987255 B2 | 10/2007 |
| WO | 2018201060 A1 | 11/2018 |

OTHER PUBLICATIONS

"Intel® Arria® 10 Native Fixed Point DSP IP Core User Guide", Intel Corporation, Mar. 13, 2017.

(Continued)

*Primary Examiner* — Suchin Parihar
(74) *Attorney, Agent, or Firm* — Glass & Associates; Larry Goerke; Alan Heimlich

(57) ABSTRACT

A method and apparatus for estimating signal related delays in a PLD design is disclosed. The PLD design is modeled in relation to one or more stages, each of the stages including a driver and one or more receivers coupled to the driver with a wiring tree. The modeling is based on a selected set of parameters that include: slope related delays associated with the driver; a delay related to a layout of the wiring tree; and a parameter related to a slope transfer from a previous driver input. A predetermined set of values for each of the selected parameters are accessed; the estimated signal related delays are computed for each of the modeled stages; and are written to a computer-readable storage medium.

16 Claims, 13 Drawing Sheets

(56)                    References Cited

U.S. PATENT DOCUMENTS

| | | | |
|---|---|---|---|
| 5,132,571 A | 7/1992 | McCollum et al. | |
| 5,191,241 A | 3/1993 | McCollum et al. | |
| 5,198,705 A | 3/1993 | Galbraith et al. | |
| 5,440,245 A | 8/1995 | Galbraith et al. | |
| 5,610,534 A | 3/1997 | Galbraith et al. | |
| 5,724,276 A | 3/1998 | Rose et al. | |
| 5,781,033 A | 7/1998 | Galbraith et al. | |
| 5,832,215 A | 11/1998 | Kato et al. | |
| 6,735,748 B1 | 5/2004 | Teig et al. | |
| 6,781,408 B1 | 8/2004 | Langhammer | |
| 6,857,112 B1 | 2/2005 | Teig et al. | |
| 6,883,148 B1 | 4/2005 | Teig et al. | |
| 6,892,366 B1 | 5/2005 | Teig et al. | |
| 7,051,293 B1 | 5/2006 | Teig et al. | |
| 7,185,299 B1 | 2/2007 | Jayaraman | |
| 7,268,584 B1 | 9/2007 | Cashman et al. | |
| 7,430,137 B2 | 9/2008 | Greene et al. | |
| 7,463,061 B1 | 12/2008 | Greene et al. | |
| 7,480,786 B1 | 1/2009 | Crabill | |
| 7,735,039 B1 | 6/2010 | Dasasathyan et al. | |
| 7,804,321 B2 | 9/2010 | Greene et al. | |
| 7,816,946 B1 | 10/2010 | Hecht et al. | |
| 7,882,471 B1 | 2/2011 | Kariat et al. | |
| 7,884,640 B2 | 2/2011 | Greene et al. | |
| 7,919,977 B2 | 4/2011 | Greene et al. | |
| 7,932,744 B1 | 4/2011 | Greene et al. | |
| 7,932,745 B2 | 4/2011 | Hecht et al. | |
| 8,415,650 B2 | 4/2013 | Greene et al. | |
| 8,504,956 B1 * | 8/2013 | Shebaita | G06F 30/3312 |
| | | | 716/108 |
| 8,723,151 B2 | 5/2014 | Greene et al. | |
| 8,981,328 B2 | 3/2015 | Greene et al. | |
| 9,000,807 B2 | 4/2015 | Greene et al. | |
| 9,103,880 B2 | 8/2015 | Greene et al. | |
| 9,147,836 B2 | 9/2015 | Greene et al. | |
| 9,514,804 B2 | 12/2016 | Greene | |
| 9,991,894 B2 | 6/2018 | Greene et al. | |
| 10,256,822 B2 | 4/2019 | Greene et al. | |
| 10,361,702 B2 | 7/2019 | Greene et al. | |
| 10,515,135 B1 | 12/2019 | Zejda et al. | |
| 10,523,208 B2 | 12/2019 | Hecht et al. | |
| 10,678,724 B1 | 6/2020 | ChoFleming et al. | |
| 10,714,180 B2 | 7/2020 | McCollum et al. | |
| 10,855,286 B2 | 12/2020 | Greene et al. | |
| 10,936,286 B2 | 3/2021 | Greene et al. | |
| 10,971,216 B2 | 4/2021 | Greene et al. | |
| 11,023,559 B2 | 6/2021 | McCollum et al. | |
| 11,355,187 B2 | 6/2022 | Nguyen et al. | |
| 2007/0136706 A1 * | 6/2007 | Hwang | G06F 30/367 |
| | | | 716/113 |
| 2009/0013293 A1 | 1/2009 | Buehler et al. | |
| 2011/0204918 A1 * | 8/2011 | Nojiri | G06F 30/3312 |
| | | | 716/108 |
| 2012/0068229 A1 | 3/2012 | Bemanian et al. | |
| 2012/0319730 A1 | 12/2012 | Fitton et al. | |
| 2016/0246571 A1 | 8/2016 | Walters, III | |
| 2016/0315619 A1 | 10/2016 | Fan et al. | |
| 2017/0193136 A1 * | 7/2017 | Prasad | G06F 30/327 |
| 2018/0095930 A1 | 4/2018 | Lu et al. | |
| 2019/0057174 A1 | 2/2019 | Hashimoto | |
| 2019/0121928 A1 | 4/2019 | Wu et al. | |
| 2019/0190522 A1 | 6/2019 | Greene et al. | |
| 2019/0213234 A1 | 7/2019 | Bayat et al. | |
| 2020/0019375 A1 | 1/2020 | Pugh et al. | |
| 2020/0020393 A1 | 1/2020 | Al-Shamma | |
| 2020/0150925 A1 | 5/2020 | Greene et al. | |
| 2020/0233482 A1 | 7/2020 | Tran et al. | |
| 2020/0234111 A1 | 7/2020 | Tran et al. | |
| 2021/0173993 A1 | 6/2021 | Raman et al. | |
| 2021/0226661 A1 | 7/2021 | de Haas | |
| 2021/0232658 A1 | 7/2021 | McCollum et al. | |

OTHER PUBLICATIONS

"LatticeECP4 DSP Slice Architecture", White Paper, Lattice Semiconductor, Hillsboro Oregon, Nov. 2011.

"UltraScale Architecture DSP Slice User Guide", Xilinx Corporation, (v1.4) Jun. 1, 2017.

Bor, et al., "Realization of the CMOS Pulsewidth-Modulation(PWM) Neural Network with On-Chip Learning", IEEE Transactions on Circuits and Systems-II: Analog and Digital Signal Processing, vol. 45, No. 1, pp. 96-107, Jan. 1, 1998.

Hamilton, et al., "Integrated Pulse Stream Neural Networks: Results, Issues, and Pointers", IEEE Transactions on Neural Networks, vol. 3, No. 3, pp. 385-393, May 1992.

Peter, et al., "Enhancing the Area Efficiency of FPGAs With Hard Circuits Using Shadow Clusters", IEEE Transactions on Very Large Scale Integration (VLSI) Systems, vol. 18, No. 12, Dec. 2010.

"Virtex-4 FPGA User Guide", UG070 (v2.6), Xilinx, Inc., San Jose, CA, Dec. 1, 2008.

B. Khurshid and R. N. Mir, "High efficiency generalized parallel counters for look-up table based FPGAs," International Journal of Reconfigurable Computing, vol. 2015, Article ID 518272, 16 pages, 2015 (Year: 2015).

J. Hormigo, M. Ortiz, F. Quiles, F. J. Jaime, J. Villalba and E. L. Zapata, "Efficient Implementation of Carry-Save Adders in FPGAs," 2009 20th IEEE International Conference on Application-specific Systems, Architectures and Processors, pp. 207-210, 2009 (Year: 2009).

M. Kumm and P. Zipf, "Efficient High Speed Compression Trees on Xilinx FPGAs," in Methoden und Beschreibungssprachen zur Modellierung und Verifikation von Schaltungen und Systemen (MBMV), pp. 171-182, 2014 (Year: 2014).

Michael T Frederick et al, "Beyond the arithmetic constraint", FPGA 2008 : Sixteenth ACM/SIGDA International Symposium on Field-Programmable Gate Arrays, Feb. 24, 2008 (Feb. 24, 2008), pp. 37-46, XP058166147, DOI: 10.1145/1344671.1344679, ISBN: 978-1-59593-934-0, Monterey Beach Resort, Monterey, California, USA, Feb. 24-26, 2008, New York, NY : Association for Computing Machinery, US.

Thomas B Preusser et al., "Mapping basic prefix computations to fast carry-chain structures", Field Programmable Logic and Applications (FPL) 2009 International Conference on, IEEE, Piscataway, NJ, USA, Aug. 31, 2009 (Aug. 31, 2009), pp. 604-608, p. 605, left-hand column, paragraph 3-p. 607, left-hand column, paragraph 5; figures 1,2.

Thomas B. Preusser et al., "Enhancing FPGA Device Capabilities by the Automatic Logic Mapping to Additive Carry Chains", Field Programmable Logic and Applications (FPL), 2010 International Conference on, IEEE, Piscataway, NJ, USA, Aug. 31, 2010 (Aug. 31, 2010), pp. 318-325.

Lu Yaojie et al: "Vector Coprocessor Virtualization for Simultaneous Multithreading", ACM Transactions on Embedded Computing Systems, ACM, New York, NY, vol. 15, No. 3, May 23, 2016 (May 23, 2016), pp. 1-25, XP058676798, ISSN: 1539-9087, DOI: 10.1145/2898364 abstract; figures 1-14; tables I-XIV p. 3, paragraph 2-p. 25, paragraph 1.

PCT/US22/28744, "International Search Report and Written Opinion," European Patent Office, mailed Dec. 6, 2022.

M. Guillorn, FinFET performance advantage at 22nm: An AC perspective, 2008, IEEE Symposium on VLSI Technology, 12-13. DOI:https://doi.org/10.1109/VLSIT.2008.4588544.

C. Chiasson, V. Betz, COFFE: Fully-automated transistor sizing for FPGA, 2013, 2013 International Conference on Field-Programmable Technology (FPT) 34-41. DOI:https://doi.org/10.1109/FPT.2013.6718327.

D. Lewis, The Stratix routing and logic architecture, 2003, In Proceedings of the 2003 ACM/SIGDA eleventh International symposium on Field programmable gate arrays, 12-20. DOI: https://doi.org/10.1145/611817.611821.

L.T. Pillage and R.A. Rohrer, Asymptotic waveform evaluation for timing analysis., 1990, IEEE Transactions on Computer-Aided Design of Integrated Circuits and Systems, 9(4), 352-366. DOI:https://doi.org/10.1109/43.45867.

Martin, T., Gréwal, G., & Areibi, S., A Machine Learning Approach to Predict Timing Delays During FPGA Placement, Jun. 2021, 2021

(56) References Cited

OTHER PUBLICATIONS

IEEE International Parallel and Distributed Processing Symposium Workshops (IPDPSW) (pp. 124-127). IEEE. DOI: https://doi.org/10.1109/IPDPSW52791.2021.00026.

P. Maidee, C. Neely, A. Kaviani and C. Lavin, An Open-Source Lightweight Timing Model for RapidWright, 2019, International Conference on Field-Programmable Tech., 171-178, DOI: 10.1109/ICFPT47387.2019.00028.

Raman, M., Abdallah, N., & Dunoyer, J., An Artificial Intelligence Approach to EDA Software Testing: Application to Net Delay Algorithms in FPGAs, Mar. 2019, 20th International Symposium on Quality Electronic Design (ISQED) (pp. 311-316). IEEE. DOI:https://doi.org/10.1109/ISQED.2019.8697652.

Shrager, R. L., & Hill, E., Nonlinear curve-fitting in the $?_1$ and $L_\infty$ norms, 1980, Mathematics of Computation, 34(150), 529-541. DOI:https://doi.org/10.1090/S0025-5718-1980-0559201-X.

W. Elmore, The transient response of damped linear networks with particular regard to wideband amplifiers, 1948, Journal of Applied Physics 19(1), 55-63. DOI:https://doi.org/10.1063/1.1697872.

Myeong-Eun Hwang et al: "Slope Interconnect Effort: Gate-Interconnect Interdependent Delay Modeling for Early CMOS Circuit Simulation", IEEE Transactions on Circuits and Systems I: Regular Papers, IEEE, US, vol. 56, No. 7, Jul. 1, 2009 (Jul. 1, 2009), pp. 1428-1441, pp. 1431-1433, XP011280499, ISSN: 1549-8328, DOI: 10.1109/TCSI.2008.2006217.

PCT/US2022/028744, Invitation to Pay Additional Fees and, Where Applicable, Protest Fees, European Patent Office, mailed Sep. 1, 2022.

* cited by examiner

100

| TERM | TERM | TERM | TERM | TERM | TERM | TERM | TERM | | TERM |
|------|------|------|------|------|------|------|------|------|------|
| TERM | INT | IO | INT | CLB | INT | CLB | INT | IO | TERM |
| TERM | INT | IO | INT | CLB | INT | CLB | INT | IO | TERM |
| TERM | INT | IO | INT | CLB | INT | CLB | INT | IO | TERM |
| TERM | INT | IO | INT | CLB | INT | CLB | INT | IO | TERM |
| TERM | INT | IO | INT | CLB | INT | CLB | INT | IO | TERM |
| TERM | INT | IO | INT | CLB | INT | CLB | INT | IO | TERM |
| TERM | INT | IO | INT | CLB | INT | CLB | INT | IO | TERM |
| | ••• | ••• | ••• | ••• | ••• | ••• | ••• | ••• | |
| TERM | TERM | TERM | TERM | TERM | TERM | TERM | TERM | | TERM |

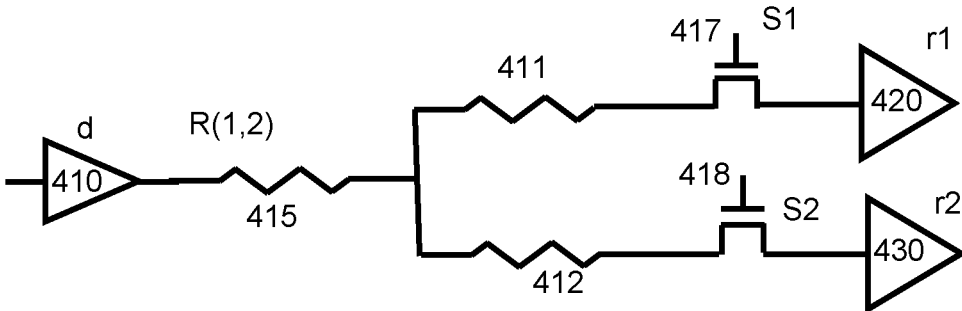
FIG. 4A
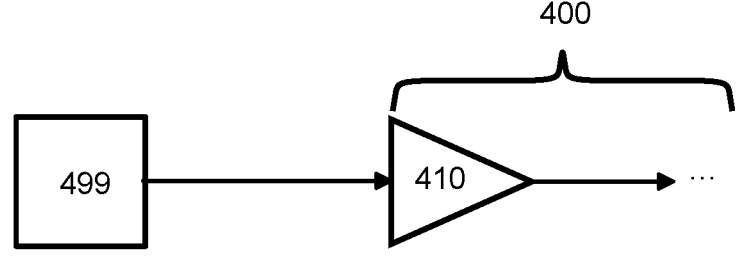
FIG. 4B

Figure 5:
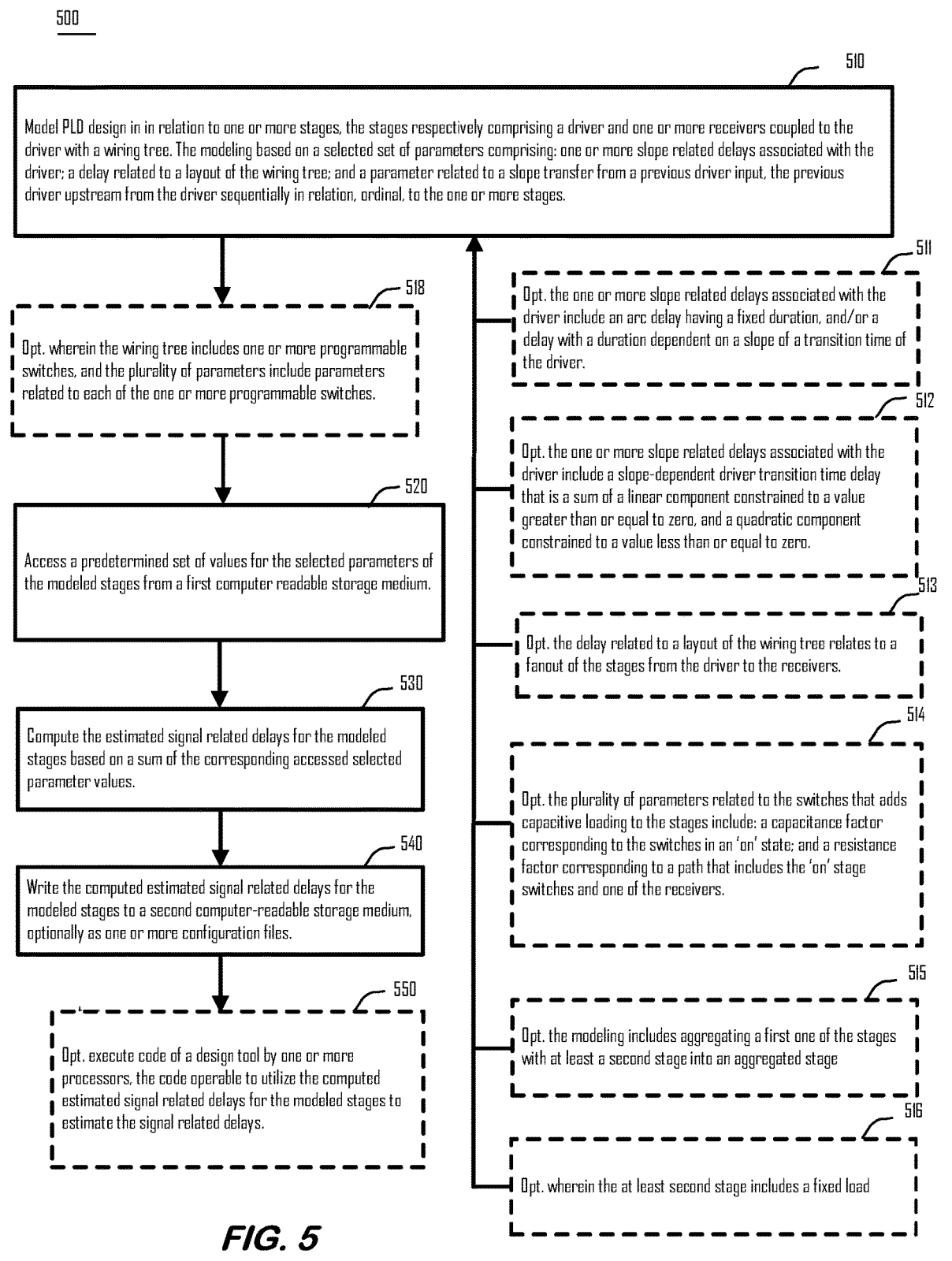

500

510

Model PLD design in in relation to one or more stages, the stages respectively comprising a driver and one or more receivers coupled to the driver with a wiring tree. The modeling based on a selected set of parameters comprising: one or more slope related delays associated with the driver; a delay related to a layout of the wiring tree; and a parameter related to a slope transfer from a previous driver input, the previous driver upstream from the driver sequentially in relation, ordinal, to the one or more stages.

511

Opt. the one or more slope related delays associated with the driver include an arc delay having a fixed duration, and/or a delay with a duration dependent on a slope of a transition time of the driver.

518

Opt. wherein the wiring tree includes one or more programmable switches, and the plurality of parameters include parameters related to each of the one or more programmable switches.

512

Opt. the one or more slope related delays associated with the driver include a slope-dependent driver transition time delay that is a sum of a linear component constrained to a value greater than or equal to zero, and a quadratic component constrained to a value less than or equal to zero.

520

Access a predetermined set of values for the selected parameters of the modeled stages from a first computer readable storage medium.

513

Opt. the delay related to a layout of the wiring tree relates to a fanout of the stages from the driver to the receivers.

530

Compute the estimated signal related delays for the modeled stages based on a sum of the corresponding accessed selected parameter values.

514

Opt. the plurality of parameters related to the switches that adds capacitive loading to the stages include: a capacitance factor corresponding to the switches in an 'on' state; and a resistance factor corresponding to a path that includes the 'on' stage switches and one of the receivers.

540

Write the computed estimated signal related delays for the modeled stages to a second computer-readable storage medium, optionally as one or more configuration files.

515

Opt. the modeling includes aggregating a first one of the stages with at least a second stage into an aggregated stage

550

Opt. execute code of a design tool by one or more processors, the code operable to utilize the computed estimated signal related delays for the modeled stages to estimate the signal related delays.

516

Opt. wherein the at least second stage includes a fixed load

610

Populate a first data set and a second data set, each data set comprises distinct, and independent data corresponding to a plurality of target parameters, wherein the PLD design is modeled in accordance with steps 510, 520, 530 and 540 (and optionally steps 511-516) of method 500 of FIG. 5.
(Opt. the populate includes reading one or more configuration files that indicate how the plurality of target parameters are to be generated, the configuration files including computed estimated signal delays for each stages of a model)

620

Compute a first simulation of a circuit corresponding to the modeled PLD design based on the first data set wherein a corresponding first set of target parameters is fitted.
(Opt. first set of values is fitted based on a function of an absolute value of one or more computed prediction errors)
(Opt. the function minimizes a maximum of an absolute value of one or more computed prediction errors)
(Opt. a pair of slope related delays associated with the driver are recorded, in which each of the stages includes at least one fanout, each of the fanouts spanning from the driver of the stage to one of the receivers thereof, and coupled to the driver with the wiring tree thereof between the driver and the receiver, and an active path in the fanout from the driver to the receiver including at least one switch in a conductive 'on' state

630

Compute a second simulation of the circuit corresponding to the modeled PLD design based on the second data set wherein a corresponding second set of values related to a plurality of guard bands are defined.
(Opt. the second set of values related to the plurality of guard bands includes a broad array of varying independent variables related to which of the programmable switches are in a conductive state, which of the one or more stages drives a stage under test, and which of one or more physical layouts of the PLD correspond to the stages, there being no overlap between the first data set and the second data set)

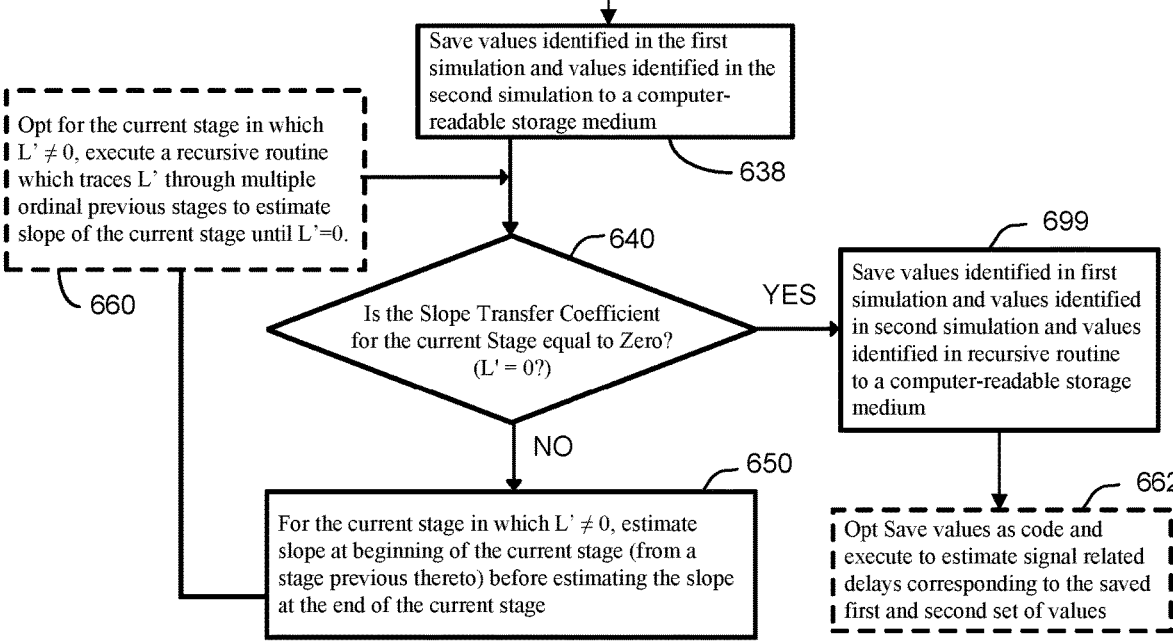

FIG. 6

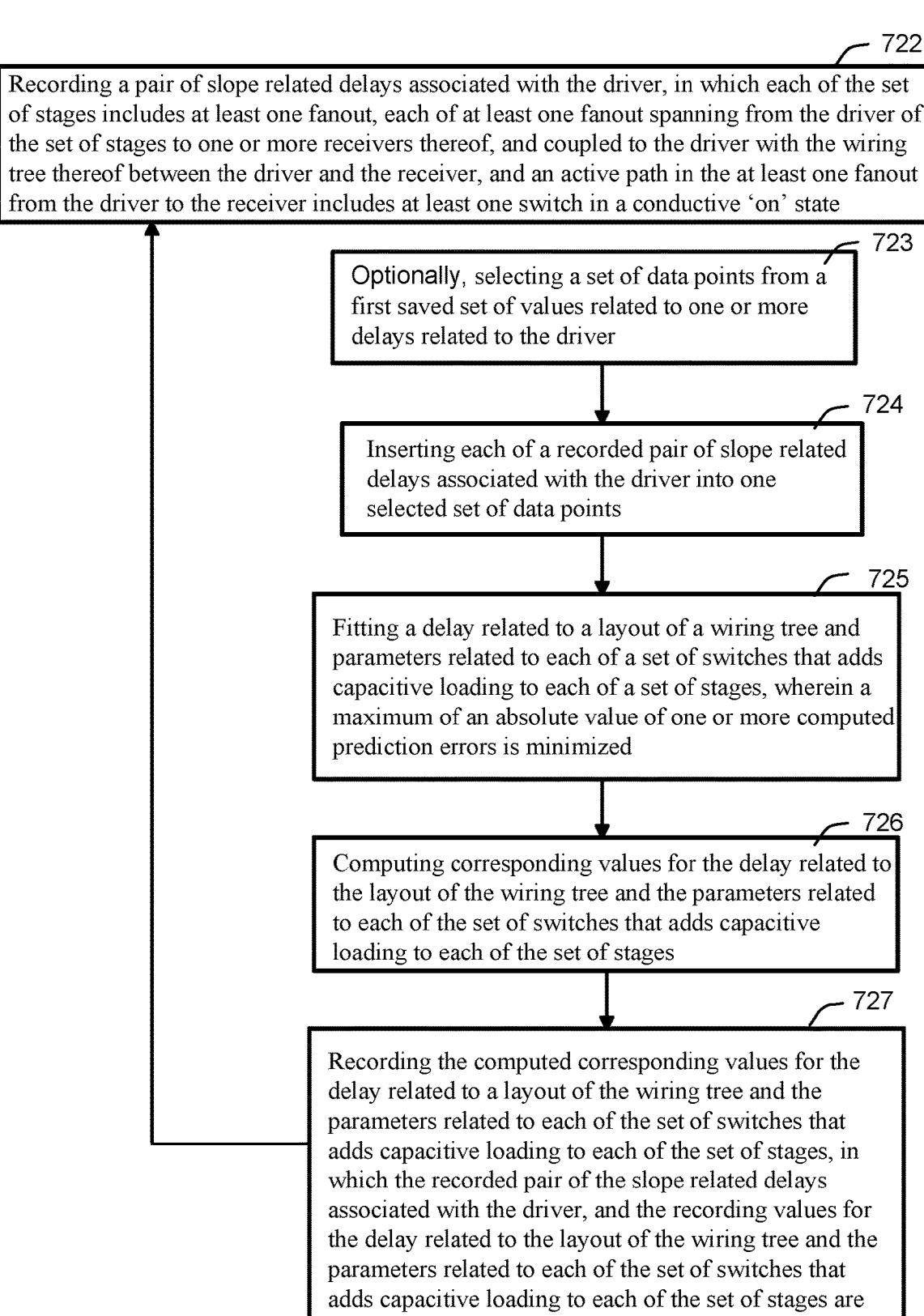

722

Recording a pair of slope related delays associated with the driver, in which each of the set of stages includes at least one fanout, each of at least one fanout spanning from the driver of the set of stages to one or more receivers thereof, and coupled to the driver with the wiring tree thereof between the driver and the receiver, and an active path in the at least one fanout from the driver to the receiver includes at least one switch in a conductive 'on' state

723

Optionally, selecting a set of data points from a first saved set of values related to one or more delays related to the driver

724

Inserting each of a recorded pair of slope related delays associated with the driver into one selected set of data points

725

Fitting a delay related to a layout of a wiring tree and parameters related to each of a set of switches that adds capacitive loading to each of a set of stages, wherein a maximum of an absolute value of one or more computed prediction errors is minimized

726

Computing corresponding values for the delay related to the layout of the wiring tree and the parameters related to each of the set of switches that adds capacitive loading to each of the set of stages

727

Recording the computed corresponding values for the delay related to a layout of the wiring tree and the parameters related to each of the set of switches that adds capacitive loading to each of the set of stages, in which the recorded pair of the slope related delays associated with the driver, and the recording values for the delay related to the layout of the wiring tree and the parameters related to each of the set of switches that adds capacitive loading to each of the set of stages are written to a computer readable storage medium

Figure 8:
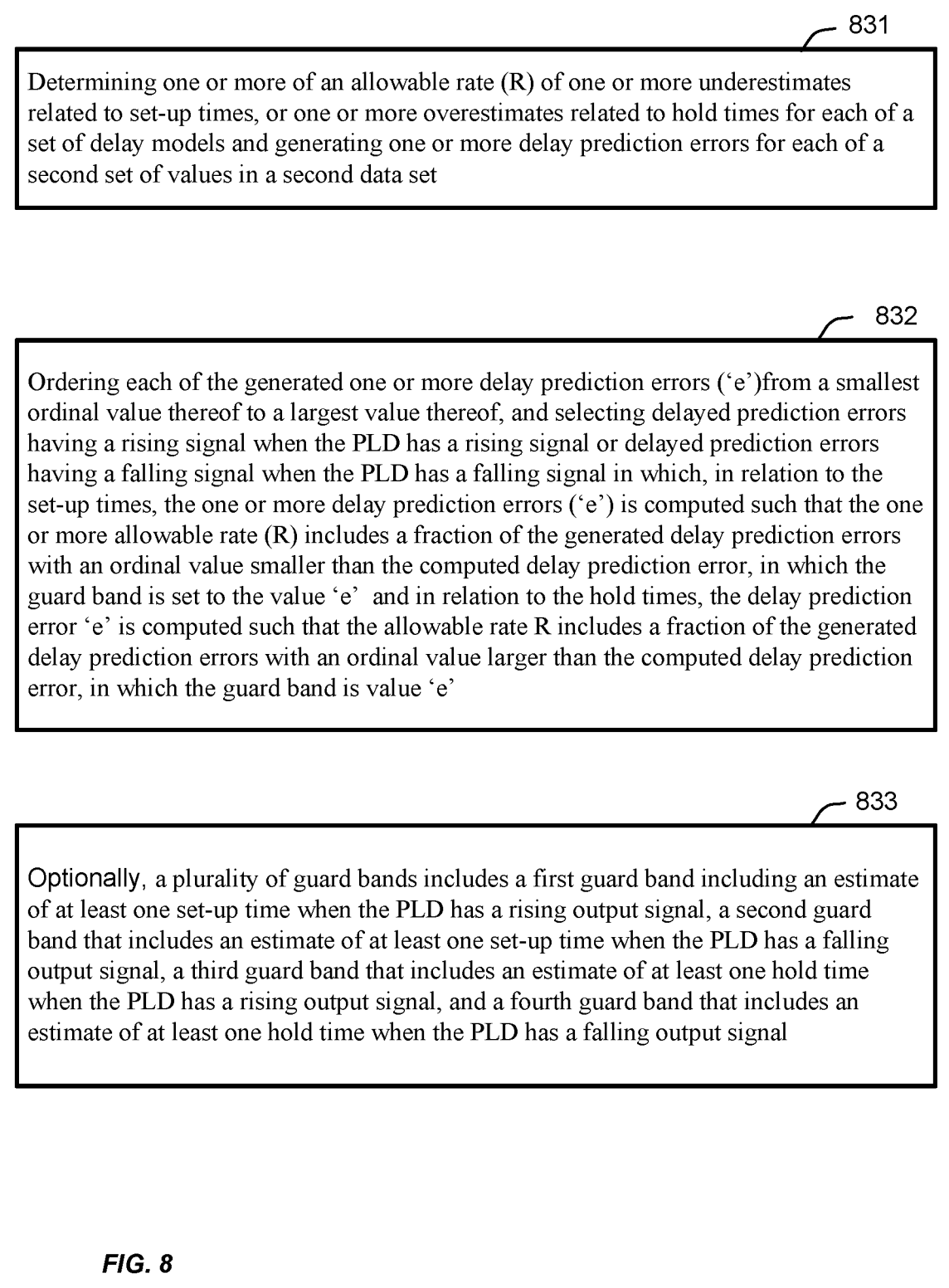

Determining one or more of an allowable rate (R) of one or more underestimates related to set-up times, or one or more overestimates related to hold times for each of a set of delay models and generating one or more delay prediction errors for each of a second set of values in a second data set

832

Ordering each of the generated one or more delay prediction errors ('e')from a smallest ordinal value thereof to a largest value thereof, and selecting delayed prediction errors having a rising signal when the PLD has a rising signal or delayed prediction errors having a falling signal when the PLD has a falling signal in which, in relation to the set-up times, the one or more delay prediction errors ('e') is computed such that the one or more allowable rate (R) includes a fraction of the generated delay prediction errors with an ordinal value smaller than the computed delay prediction error, in which the guard band is set to the value 'e' and in relation to the hold times, the delay prediction error 'e' is computed such that the allowable rate R includes a fraction of the generated delay prediction errors with an ordinal value larger than the computed delay prediction error, in which the guard band is value 'e'

833

Optionally, a plurality of guard bands includes a first guard band including an estimate of at least one set-up time when the PLD has a rising output signal, a second guard band that includes an estimate of at least one set-up time when the PLD has a falling output signal, a third guard band that includes an estimate of at least one hold time when the PLD has a rising output signal, and a fourth guard band that includes an estimate of at least one hold time when the PLD has a falling output signal

$$D(j, T, P, \underline{X}) = A \ + LT + QT^{2} \ + B(j, P) + \sum_{s \in S} K(s, j) R(s, j, P) \, X(s)$$

Equation 1

1300

$$T\left(j, T_{in}, P, \underline{X}\right) = L^{'} T_{in} + B'(j, P) + \sum_{s \in S} K'(s, j) R(s, j, P) X(s)$$

Equation 2

*FIG. 13*

METHOD AND APPARATUS FOR ESTIMATING SIGNAL RELATED DELAYS IN A PLD DESIGN

CROSS-REFERENCE TO RELATED APPLICATIONS

The present application claims the benefit under 35 U.S.C. § 119 of the priority date of U.S. Provisional Patent Application Ser. No. 63/190,237 filed on May 18, 2021 by the same inventors, the entire contents of which are incorporated by reference as if fully set forth herein.

BACKGROUND

Some Integrated Circuits (ICs) have a structural design dedicated to a specific operational function. Such ICs are generally referred to as an Application Specific IC (ASIC). In designing an ASIC, a simulation program such as 'SPICE' ('Simulation Program with IC Emphasis') is run to predict operational behavior of the ASIC.

The structure and corresponding operational function of some ICs however are programmable in relation to performing one or more logical functions. An IC with such programmable characteristics is generally referred to as a Programmable Logic Device (PLD). There are various types of programmable logic devices (PLDs).

As used herein, one type of PLD is referred to as a Field Programmable Gate Array (FPGA) and has an array of transistors. Each of the transistors has a conduction ('on/off') state controllable by a gate voltage supplied thereto. A logic function performed by the FPGA or PLD is thus programmable based on configuring the on/off state of the transistors ("switches") of the array.

PLDs are sometimes (e.g. FPGAs) programmed "in the field," for example by an end user. While running circuit simulation programs such as 'SPICE' ('Simulation Program with IC Emphasis') to predict operational behavior of the device is efficient and convenient on an IC supplier's end (e.g., with IC fabricators, manufacturers, vendors), in which the supplier designs and manufactures an IC device and has access to (and/or perhaps even generated) detailed circuit netlists relevant thereto, it is generally inconvenient, expensive, inefficient and excessively time consuming to use simulation tools such as SPICE in the field, where PLDs such as FPGAs are routinely deployed and programmed in situ.

An example implementation relates to a method for producing a set of delay models for the circuit elements on the PLD, allowing deployment of the set of delay models in design toolsets for the PLDs, and for analyzing circuit timing across a design toolset chain (e.g., to determine speeds at which their circuit designs are expected to perform on the PLDs).

Toolsets with various delay models however generally generate different predictions, depending on how the delay models are constructed and how well they approximate the real delays on the silicon. Unfortunately, the inaccuracy of delay models generated using conventional techniques demands the use of many guard bands to be conservative. Such excessive use of the guard bands increases the delay estimate and thus generally reduces the predicted operating frequency in an effort to ensure that a user design is at least functionally correct and operable.

Therefore, although the PLD can run the user design at higher frequencies, conventional toolsets generally predict a lower operating frequency. This constrains the user to setting up a clock frequency for the PLD according to the lower frequency prediction generated by the toolset. When the PLD is ultimately programmed based on configuration data so constrained, its operable performance (e.g., speed) is likely thus less than (e.g., slower than) that, which the PLD is actually capable of achieving if not so constrained.

What is needed is a method of modeling delays in designs of a PLD, which is high-level and concise to be suitable for integration into the FPGA design toolset, yet expressive to model the different configurations of PLDs for different user designs and predict the on-the-silicon operating frequency of the PLD with greater accuracy.

BRIEF SUMMARY

A method for estimating signal related delays in a programmable logic device (PLD) design includes modeling the PLD design in relation to one or more stages, each of the stages including a driver and one or more receiver inputs coupled to the driver with a wiring tree, where the wiring tree includes none, or one or more programmable switches. The modeling is based on a selected set of parameters that include: one or more slope related delays associated with the driver; a delay related to a layout of the wiring tree; and a parameter related to a slope transfer from a previous driver input, the previous driver upstream from the driver sequentially in relation, ordinally, to the one or more stages. In the event that the wiring tree includes one or more programmable switches, the modeling is additionally based on a plurality of parameters related to each of the switches, since the switches add capacitive loading to each of the stages. A predetermined set of values for each of the selected parameters of each of the modeled stages are accessed from a first computer readable storage medium. The estimated signal related delays for each of the modeled stages are computed based on a sum of the corresponding accessed selected parameter values. The computed estimated signal related delays for each of the modeled stages are written to a computer-readable storage medium.

A tangible, computer readable storage medium comprising code is disclosed, which when executed by one or more processors, causes or controls the performance of a process related to the previously described method for estimating signal related delays in a PLD design, for estimating the signal related delays.

A method of determining values for each of a set of parameters related to one or more delay models of a PLD design includes: populating a first dataset and a second dataset, which each data set comprises distinct, and independent data corresponding to a plurality of target parameters, wherein the PLD design is modeled in relation to one or more stages, each of the stages including a driver and one or more receiver inputs coupled to the driver with a wiring tree, the wiring tree includes none, or one or more programmable switches. The target parameters include: one or more slope related delays associated with the driver; a delay related to a layout of the wiring tree; a plurality of parameters related to each of the switches, if any, that adds capacitive loading to each of the stages; and a parameter related to a slope transfer from a previous driver input, the previous driver upstream from the driver sequentially in relation, ordinally, to the one or more stages. A first simulation of a circuit corresponding to the modeled PLD design is computed based on the first dataset where a corresponding first set of values related to the target parameters is fitted. A second simulation of the circuit corresponding to the modeled PLD design is computed based on the second dataset where a corresponding second set of values related to a plurality of guard bands are defined. The first set of values and the second set of values are saved, wherein the saved first and second set of values are written to a computer-readable storage medium as code, which when executed by one or more processors are operable for estimating the signal related delays corresponding to the saved first and second set of values upon accessing and executing the code.

The first data set and the second data set generally have no overlapping test cases and are independent of each other because overlapping test cases do not give new information.

The method and apparatus of the present disclosure allows for modeling delays in designs of a PLD, that allows a toolset to predict the on-the-silicon operating frequency of the PLD with greater accuracy than that obtained using conventional techniques in which many restrictive guard bands are used to generate a low frequency prediction and in which the clock frequency for the PLD is set according to the low frequency prediction generated by the toolset.

As noted, the method and apparatus of the present disclosure allows for modeling delays in designs slated for a PLD. Since any model is an approximation to reality, necessarily the model and/or the parameters therein are often "fitted" to an acceptable level of "error" from reality. Thus "fit", "fitted", and "fitting" and similar terms are to be understood as adjusting the model and/or parameters to acceptable values based on some engineering predefined "error" from reality.

Take for example a modeling of a resistance wherein the model only has resistance values in increments of 10 ohms, that is a resistance can be 10 ohms, 20 ohms, . . . , 3004850 ohms, . . . 10 G ohm, . . . , without limitation. If the actual resistance is 111 ohms then a decision needs to be made how to model the 111 ohms. In one approach the actual value is "fitted" to the nearest model with the least "error". One option in this example is to model the 111 ohm actual resistance as a 110 ohm resistance, with a resulting "error" of $-1$ ohm ($110-111=-1$). The other nearest model is to model the 111 ohm actual resistance as a 120 ohm resistance, with a resulting "error" of $+9$ ohms ($120-111=+9$). Choosing a model of 110 ohms underestimates the actual value and a model of 120 ohms overestimates the actual value. Depending on the user selected criteria one or the other model value would be used. For example, if the actual resistance is directly related to a circuit timing then selecting the lower model of 110 ohms will result in a faster response than reality, and selecting the upper model of 120 ohms will result in a slower response than reality. If the user criteria is to make sure the circuit works, then choosing the 120 ohm model is more prudent.

Similar to the example of the resistor above the modeling of timing, delays, capacitance and other parameters influence if the user wants to err on underestimating or overestimating.

The "error" can be considered a predicted error sometimes denoted 'e' if we can compute its likely range.

The goal of the modeling is to get as close as possible to reality so as, for example, to run a design at the highest frequency possible. If a user designs to the absolute edge then there is no margin. For example, if the design edge is suited for operation at 1.1013 GHz operation and the temperature changes 1 deg C. it's likely the design will stop operating. Thus, engineers look to use guard bands which are outside the absolute edge of a design and allow for proper operation by "guarding" the design, timing, without limitation. For example, in the 1.1013 GHz design mentioned above, a set of simulations with conditions changed, for example, operation from $-40$ deg C. to $+125$ deg C. might yield that if the clock frequency of 1.1013 GHz is lowered to 1.0 GHz the design will operate over the $-40$ deg C. to $+125$ deg C. range. This may be an acceptable tradeoff. Guard bands are determined in models by multiple simulations where parameters are changed to see the overall effect on a design. Often the multiple simulations will lead to a range of guard bands where the user can decide what is acceptable. For example, in the 1.1013 GHz example above if the user knows that the system will only be in operation from 25 deg C. to 60 deg C., then the user may view guard bands that cover that range only and decide on the acceptable maximum clock frequency. What is to be appreciated is that guard bands can cover a variety of parameters and are used by an engineer, designer, or user to try and guarantee acceptable performance whether that be frequency, low power, or any other factor.

In logic design, for example using a flip flop in which data and a clock enter there are set-up times for data with relation to the clock both for a rising output and a falling output. Likewise for a flip flop there are data hold times for a rising output and falling output. Accordingly, it is possible to have guard bands for each of these four scenarios mentioned.

Similar to the resistance example above, with respect to the flip flop example directly above, there are overestimates and underestimates. That is, one can overestimate a data hold time to guarantee that the data is clocked in (which is good), versus underestimating a data hold time in which case data is not guaranteed to be clocked in (bad). Likewise for set-up time one is good and the other not desirable. Accordingly, depending upon the choice, different guard bands can be established to assure proper operation.

A model can also be based on a signal transition. For example, a simple inverter using a pull-up and pull-down transistor arrangement (e.g. PMOS-NMOS) can have a different delay based on a high to low signal transition, versus a low to high transition. This can be due to a variety of factors, such as, but not limited to differing transistor size (e.g. L/W), differing electron mobility, gate oxide thickness (e.g. Cox), without limitation. What is to be appreciated is that a functional block, for example a driver, may have a different high to low transition model and a low to high transition model. Accordingly, functional blocks often have a pair of models associated with them.

To explain in greater detail, the fundamental reason for an error is that the transistors in a PLD each have a non-linear behavior, which usually requires iterative numerical simulation methods to simulate. That is what a SPICE simulation does. The method and apparatus of the present disclosure create high-level and concise delay models that are closed form and use polynomial functions. Accordingly, the delay models are relatively fast to compute and suitable for use in FPGA design toolsets. However, since these delay models only approximate the real non-linear equations that dictate the physical behavior of the transistors, it is unavoidable to have some errors. The method and apparatus of the present disclosure strikes a balance between the model's conciseness and the model's expressiveness, and hence accuracy.

In the discussion above the guard band was vastly simplified to get the concept across. The method and apparatus of the present disclosure has another way of deriving guard bands. Normally an aggregated model error is determined by using the maximum or average error of the particular model for a few test cases. A model is usually fitted to minimize that aggregated model error. In the method and apparatus of the present disclosure our case, we may minimize the maximum absolute error by the technique discussed below.

Plotting the modeling error by each individual test case, reveals a bell-shaped curve like a normal distribution. Most test cases have very small absolute errors, but a few test cases may become the tail of the distribution. A bell-shaped distribution has tails on both sides, the left side tail being an underestimate of the delay and a right side tail being an overestimate of the delay. In the case of estimating circuit operating frequency, which is equivalent to performing a setup timing check in timing analysis terminology, then the left side tail population is not desirable because it gives underestimates of delays and hence overestimates of operating frequency. Therefore, we treat the amount of delay error for the left tail population as an additional guard band to be added to the model predicted delays. That is, because the left tail contains cases of delay underestimates, we decide the guard band based on the delay error at the left tail.

The guard band is obtained from a bell-shaped error distribution from the second set of test cases (data). The first set of test cases (data) is well controlled and has meaningful attributes (such as all pairs of fanouts are on) to help reduce the number of simulations to create the model. The second set of test cases (data) are more random and more evenly distributed in terms of fanout on/off combinations. It tends to capture more outliers and gives a more exact tail distribution. It is not strictly necessary to guard band all the tail points. A small portion, such as 2~5% of tail populations, may remain slightly underestimated in delays. This is because the delay models are for individual stages. As circuit operating frequency is determined by the critical circuit path consisting of multiple stages, some of the stages have positive errors and others have negative prediction errors, and they tend to cancel each other along the path. So statistically, leaving a very small portion of tail populations being mitigated for its underestimate magnitude but without completely eliminating its underestimate actually does not compromise the prediction of a circuit path delay, or the circuit performance. The benefit is a reduced need to overly guard band the model.

In hold timing analysis (also called minimum delay analysis) which relates to making synchronous circuits operate functionally correctly, preferably the prediction is not overly overestimated. That is, all circuit paths are to have some minimum delay value otherwise the circuit may have race conditions and may malfunction. However, an overestimate of delay in a delay model would give a false positive in hold timing check, while the real silicon runs the risk of violating the hold timing and malfunctioning. So the guard band is applied to the right side tail population of the bell-shaped error distribution in a manner similar to that discussed above, i.e. a small portion is remains overestimated.

BRIEF DESCRIPTION OF THE DRAWINGS

Some illustrative aspects, features and elements related to example implementations of the present disclosure are described herein with reference to the following description and drawings. Various ways in which the principles disclosed herein are practically implementable are thus described, and all aspects and equivalents thereof are intended to fall within the scope of the claimed subject matter. The foregoing, and other features and uses of the present disclosure, become more apparent in view of the following description in conjunction with each enumerated figure (FIG.) of the accompanying drawings. Throughout the specification of the present disclosure, the like reference numerals (as shown in each FIG. of the drawings) generally refer to the like components, features and/or elements. In the drawing figures, therefore:

FIG. 1 depicts an example PLD implementation;

FIG. 4A and FIG. 4B depicts an example PLD model;

FIG. 5 depicts a flowchart of an example method for modeling a PLD;

FIG. 6 depicts a flowchart of an example method for estimating a delay related to a PLD model;

FIG. 7 depicts a flowchart of an example method for computing a first circuit simulation;

FIG. 8 depicts a flowchart of an example method related to a second circuit simulation computation;

FIG. 13 depicts a second delay equation.

DETAILED DESCRIPTION

Overview

Figures 2A, 2B:
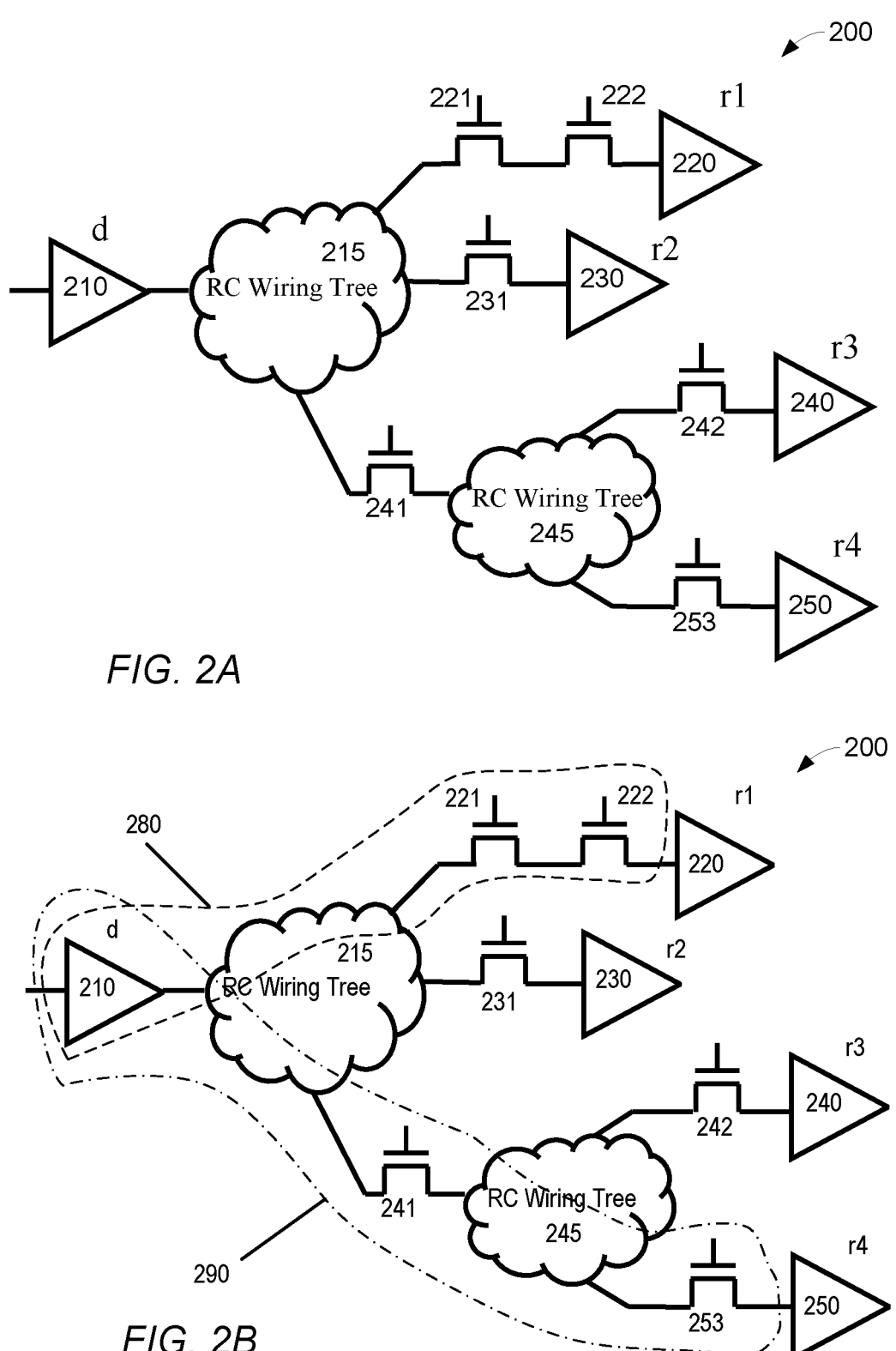
FIG. 2A depicts an example model of the PLD implementation.
FIG. 2B depicts an example model of the PLD implementation showing example stages.

In the description that follows "delay" and "time" and "delay time" and similar phrases are used interchangeably as one of skill in the art understands their units of measurement are time.

In the description that follows "delay" and "time" and "delay time" and similar phrases and "frequency" are used interchangeably as one of skill in the art understands they are the reciprocal of each other. Delay=1/Frequency, and Frequency=1/Time. The units of Frequency are Hertz, and those of time/delay are seconds.

An example implementation relates to methods for modeling delays in a PLD and estimating signal related delays in a design to be implemented on the PLD. The method includes modeling the PLD design in relation to one or more stages. Each of the stages has a driver and one or more receiver inputs coupled to the driver by a wiring tree. The wiring tree includes none, or one or more programmable switches. The modeling is based on a selected set of parameters, which include one or more slope related delays associated with the driver, a delay related to a layout of the wiring tree, a plurality of parameters related to each of the switches, if any, that adds capacitive loading to each of the stages, and a parameter related to a slope transfer from a previous driver output, the previous driver upstream from the driver sequentially in relation, ordinally, to the one or more stages.

A predetermined set of values is accessed for each of the selected parameters of each of the modeled stages from a first computer readable storage medium. The estimated signal related delays are computed for each of the modeled stages based on a sum of the corresponding accessed selected parameter values. The parameters can be coefficients of independent variables (e.g. LT) or the coefficient of the square of an independent variable (e.g. $QT^2$). The computed estimated signal related delays for each of the modeled stages is written to a second computer-readable storage medium which is used to determine a guard band for the PLD maximum operating frequency or a maximum delay analysis.

Example PLD

An example implementation relates to determining delays in a PLD. In relation to the present description, a PLD represents an Integrated Circuit (IC), which is programmably operable to perform specified processes, such as one or more logic functions. An example implementation relates to an FPGA, which represents a PLD that has an array of programmable tiles. The programmable tiles may include, for example (and without limitation), input/output blocks (IOs), configurable logic blocks (CLBs), dedicated random access memory blocks (RAM), processors, multipliers, digital signal processing blocks (DSPs), clock (CLK) managers, delay lock loops (DLLs), and interconnect lines (INT).

The programmable tiles are generally programmed by loading a stream of configuration data into internal configuration memory cells that define how the programmable elements are configured. The configuration data are read from memory (e.g., from an external PROM) or written into the FPGA by an external device. The corresponding collective states of the individual memory cells then determine the operable function of the FPGA.

FIG. 1 depicts an example PLD implementation 100. The PLD 100 is disposed on a semiconductor die 110. A fabric, network and/or pattern of conductors 120 are disposed within the semiconductor die 110 and effectuate electrical interconnection between the various tiles. The conductors 120 include electrically conductive traces and/or vias (also known, e.g., as "VIAs," or Vertical Interconnect Accessways). Thus, the PLD 100 should be understood to have a three dimensional (3D) spatial, structural, and/or electrical conductor architecture.

The PLD 100 includes columns of logic tiles including configurable logic blocks (CLBs), input/output blocks (IOs), and programmable interconnect tiles (INTs) that are used to programmably interconnect the logic tiles. Terminating tiles (TERMs) surround the columns of logic tiles and can connect the PLD 100, through the conductors 120, with a programmer for loading a user's design onto the PLD. The TERMs also couple the PLD 100 with other devices that, upon its programming, are operably controlled or otherwise interactive with the PLD 100.

The programmable tiles are programmed upon loading a stream of configuration data into internal configuration memory cells of the PLD 100, which define how the programmable elements thereof are configured. The configuration data are generally read from memory (e.g., from an external PROM) or written into the PLD 100. The corresponding collective states of the individual memory cells then determine and program the operable function of the PLD 100. For example, one or more of the CLBs are thus configurable to implement Digital Signal Processing (DSP), Digital Lock Loop (DLL), Clock (CLK), or other logic functions.

While an example implementation of the delay calculations for PLD 100 is described in relation to an FPGA, it should be understood and appreciated that additional and/or alternative implementations relate to other types of PLDs. For example, an example implementation relates to a PLD programmed with application of a processing layer, such as a conductive (e.g., metallic) layer, which interconnects the various components of the PLD 100. Such PLDs are sometimes referred to as "mask programmable" PLDs.

In an additional or alternative implementation, the operability state of the PLD 100 is configured using fuse and/or anti-fuse processing. The terms "PLD," and "programmable logic device," as well as the example FPGA implementation described herein, should be understood, without limitation, to describe these devices, and devices that are partially (but not wholly) programmable, such as an IC that includes a combination of hard-coded transistor logic and a programmable switch fabric, which programmably interconnects the hard-coded transistor logic.

Example PLD Models

FIG. 2A and FIG. 2B each depict an example model 200 of the PLD implementation. In an example implementation, the model 200 represents, e.g., "abstracts" a portion of the PLD 100 (FIG. 1). The features and elements described in relation to FIGS. 2A-2B should be understood to be programmed based on a stream of configuration data, loaded into internal configuration memory cells of the PLD 100. The model 200 represents an implementation of a programmed FPGA configuration of at least a portion of the PLD 100.

The model 200 represents the PLD 100 as having one or more delay stages, which are also referred to herein as 'Utrees'. The model 200 depicted has a driver ('d') 210 and one or more receivers (e.g., 220, 230, 240, 250 denoted r1, r2, r3, r4 respectively), which are coupled to the driver 210 with a first resistive/capacitive ('RC') wiring tree 215 connecting to r1 and r2, and through a second RC wiring tree 245 to r3 and r4. The first RC wiring tree 215 connects to programmable switches arranged in a plurality of fanouts from the driver 210 to each of the receivers r1 and r2 (and in the case of r3 and r4 through a second RC wiring tree 245 after first going through programmable switch 241).

A first fanout from driver 210 to receiver 220 includes the driver 210 output, RC Wiring Tree 115, programmable switches 221 and 222, and to the input of receiver r1 220. This first fanout is illustrated in FIG. 2B by the dashed line labeled 280. Note that this fanout includes the driver (d) 210 output, a portion of the 215 RC wiring tree that connects with switch 221, and switch 222, and to the input of the receiver (r1) 220.

A second fanout from 210 to 230 (denoted 210-230) includes a second receiver 230 (r2) input, which is coupled to the driver 210 output through the RC wiring tree 215 and a switch 231.

A third fanout 210-240/250 includes a fourth fanout 210-240, and a fifth fanout 210-250. The fourth fanout 210-240 includes the driver d 210, part of RC wiring tree 215, switch 241, part of RC wiring tree 245, switch 242, and to a third receiver 240 (r3) input. The fifth fanout 210-250 includes the driver d 210 output, part of RC wiring tree 215, the switch 241, part of RC wiring tree 245, the switch 253, and to a fourth receiver (r4) 250. For illustrative purposes only, in FIG. 2B at 290 is shown the fifth fanout 210-250 with a dash-dot line.

Figure 3:
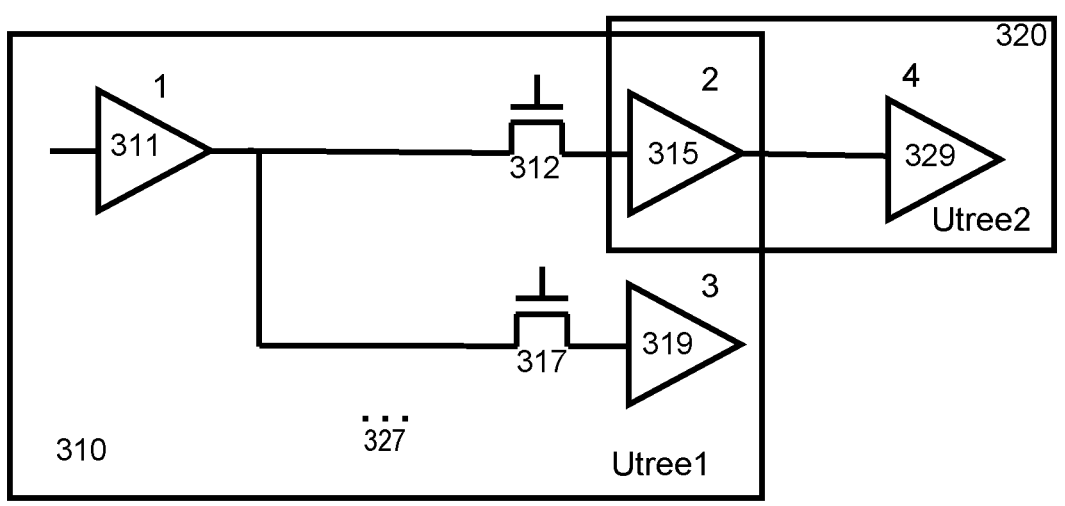
FIG. 3 depicts an example model of a PLD implemented with aggregated Utrees.

FIG. 3 depicts an example model of a PLD. An example implementation relates to aggregating a portion of delay stages 310 'Utree1' with at least a portion of a second of the delay stages 320 'Utree2' into the aggregated stage 320.

Utree1 310 includes a driver 311 (1), a first receiver 315 (2), and a second receiver 319 (3). The first receiver 315 (2) is coupled to the first driver 311 (1) through a wiring tree, which includes the switch 312. The second receiver 319 (3) is coupled to the first driver 311 (1) through a wiring tree, which includes the switch 317. It should be noted that the wiring tree connects the output of driver 311 (1) to switches 312, 317, and optionally other switches. As shown in FIG. 3 the wiring tree connects the output of driver 311 (1) to switch 312, switch 317, and any other branches with switches that may exist as denoted by the ellipsis at 327.

Aggregated Utree2 320 includes driver 315 (2) (which is implemented as a function of the first receiver 315 (2) and a fourth receiver 329 (4). The fourth receiver 329 (4) is coupled to the second driver 315 (2) through a respective portion of the wiring tree, which is implemented to have a fixed load (e.g., without active switches).

Driver 315 is aggregated with receiver 329 to define Utree2 320. Utree 300 includes driver 311 (1), receiver 319 (3) and the receiver 329 (4). Thus, from the standpoint of the driver 311 (1) it has two receiver endpoints, receiver 319 (3), and receiver 329 (4).

It should be noted for aggregation purposes that the aggregated Utree, i.e. Utree2 320 has a direct connection from Utree1 310 driver 315 output and the direct connection has a fixed load, that is the connection has no active switches. For example, as illustrated the output of 315 is directly connected to the input of 329, showing no switches present.

An example implementation relates to methods for estimating signal related delays in the design of the PLD, and includes modeling the PLD design in relation to one or more stages, as described with reference to FIG. 4A, FIG. 4B, FIG. 5, FIG. 6, FIG. 7, FIG. 8 and/or FIG. 9, below. In executing the methods, implementing the aggregated Utree 300 simplifies the computations by reducing the number of models needed.

FIG. 4A depicts an example PLD model 400. The PLD model 400 includes a driver 410 (*d*), receiver 420 (r1), and receiver 430 (r2), which are each coupled to the driver 410 (*d*) through a wiring tree that includes a common resistance 415 (R(1,2)).

Receiver 420 (r1) is coupled to the driver 410 (*d*) through the common resistance 415 (R(1,2)) and a first fanout coupled therewith. The first fanout includes a resistance 411 and a switch 417 (S1).

Receiver 430 (r2) is coupled to the driver 410 (*d*) through the common resistance 415 (R(1,2)) and a second fanout coupled therewith. The second fanout includes a resistance 412 and a switch 418 (S2).

Figure 12:
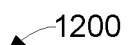
FIG. 12 depicts a first delay equation.

In an example implementation, signal related delays for the PLD model 400 are computed according to Equation 1, below also shown in FIG. 12 at 1200.

$$D(j, T, P, \underline{X}) = \qquad \text{(Equation 1)}$$
$$A + LT + QT^2 + B(j, P) + \sum_{s \in S} K(s, j)R(s, j, P)X(s)$$

In Equation 1, 'D' represents the signal related delay of the model 400. (j, T, P, $\underline{X}$) represent the variables that 'D' is a function of as detailed on the right hand side of Equation 1. j, T, P are explained below and $\underline{X}$ denotes the set of switches that are on. Underlined $\underline{X}$ is the set of switches that are on (underline indicates a vector.) X(s) is 1 if switch s is on, else 0.

In Equation 1, 'A' represents a fixed arc delay associated with the driver 410. An arc delay is a delay across a functional block, in this case the driver 410.

In Equation 1 'B(j, P)' represents a baseline wire delay to a fanout in a wiring layout P. P is dimensionless and is an index to a list of physical layouts.

In Equation 1, the sum 'LT+QT²' represents a slope-dependent delay related to the driver. An example implementation reduces overfitting by constraining the linear component L, which is the slope transfer coefficient, of the sum LT+QT² to a value greater than or equal to zero (L=>0), and constraining the quadratic component Q thereof to a value of less than or equal to zero (Q<=0). Q has the units of 1/T.

In Equation 1, the term '$\Sigma_{s \in S}$ K (s,j)R(s,j,P)X(s)' represents incremental delays added by switches in their 'on' states adding capacitance on a branch of the wiring path to the fanout 'j', which adds accuracy to the delay calculation with respect to the baseline wire delay.

When there are no switches that add capacitive loading, the terms in the summation (K, R, and X) disappear and only B parameters and the slope-dependent parameters (L/Q) and A remain.

The following independent variables in Equation 1 are represented by the symbols described in Table 1, below.

TABLE 1

| Symbol | Represents |
| --- | --- |
| j | Fanout to Receiver of Interest |
| S | Set of all Switches driven by the Driver Output |
| 's ∈ S' | "'s' is an Element of the Set 'S'" |
| X(s) | Value = 1 (one) if Switch s is 'on'; else 0 (zero) |
| T | Transition Time at the Driver Input |
| P | Physical Layout of Wiring Tree |
| R(s, j, P) | Resistance of Common Path including switch s and receiver j in layout P |
| X | Switches that are 'on' |

The common-path resistance term R(s,j,P) allows K [or K'] values to be independent of wire layout type P.

K(s,j) represents the effective capacitance introduced when turning on switch s, when measuring delay from the driver to receiver j.

Example implementations thus relate to a method for estimating the delay to particular fanouts of particular delay stages (e.g., Utrees) based on the conduction state of the switches thereof, using a parameterized delay model. The method is computed using the transition time dependent parameters (e.g., L and Q; Equation 1), each with their constrained signs, and the additive term (e.g., K(s); Equation 1) for each switch that adds capacitive loading to the stage, which includes the common path resistance factor (e.g., R(s); Equation 1).

In an example implementation, transition times are estimated, as well. The transition time, also referred to as the 'slope' of the stages, is estimated at the input of each delay stage. Like the delay estimates discussed above with reference to Equation 1, the slope estimates are computed from a previous delay stage. For each stage, an example implementation computes the delay to, and the slope at, each fanout.

In an example implementation, the slope related delays for the PLD model 400 are computed according to Equation 2, below, and as shown in FIG. 13 at 1300.

$$T(j, T_{in}, P, X) = L'T_{in} + B'(j, P) + \sum_{s \in S} K'(s, j)R(s, j, P)X(s) \qquad \text{(Equation 2)}$$

In Equation 2, 'T' represents the transition time related delay of the model 400, 'L'T$_{in}$' represents a slope transfer from a previous driver input, and 'B(j,P)' represents a baseline slope to a fanout in the wiring layout P and $\underline{X}$ denotes switches 'on'. Underlined $\underline{X}$ is the set of switches that are on (underline indicates a vector.) X(s) is 1 if switch s is on, else 0.

When there are no switches that add capacitive loading, the terms in the summation (K', R, and X) disappear and only B' parameters and the slope-dependent parameter (L') remains.

In Equation 2, the term '$\Sigma_{s \in S}K'(s,j)R(s,j,P)X(s)$' (similar to that in Equation 1) represents the incremental delays added by the switches in their 'on' states adding capacitance on the branch of the wiring path to the fanout 7, which adds accuracy to the model.

The following independent variables in Equation 2 are represented by the symbols described in Table 2, below.

TABLE 2

| Symbol | Represents |
|--------|-----------|
| j | Fanout to Receiver of Interest |
| S | Set of all Switches driven by the Driver Output |
| 's ∈ S' | "'s' is an Element of the Set 'S'" |
| X(s) | Value = 1 (one) if Switch s is 'on'; else 0 (zero) |
| L' | Slope Transfer Term (coefficient) |
| $T_{in}$ | Transition Time at the Driver Input |
| P | Physical Layout of Wiring Tree |
| R(s, j, P) | Resistance of Common Path including switch s and receiver j in layout P |
| X | Switches that are 'on' |

The common-path resistance term R(s,j,P) allows K [or K'] values to be independent of wire layout type P.

K'(s,j) represents the effective capacitance introduced when turning on switch s, when measuring delay from the driver to receiver j.

In an example implementation, the slope models use data that overlaps, partially or completely, with a data set used in the delay models, which are described above with reference to Equation 1. One or more of the stages potentially have zero slope transfer (the term 'L"; Equation 2).

FIG. 4B depicts the PLD model 400, coupled to an ordinally previous stage 499.

In view of a zero value for the slope transfer term L', an example implementation estimates the slope at the beginning of the current delay stage 400, based on the slope determined in relation to a stage 499 previous thereto, and prior to estimating the slope at the end (output) of the current delay stage 400. In an example implementation, computation of the transition time model thus includes a recursive routine, which traces through a plurality of sequential stages (e.g., multiple previous stages), including at least the previous stage 499.

In an example implementation, the recursive routine used in computing the transition time model terminates, upon computation of a result corresponding to reaching a stage, in which the slope transfer term L, which is the slope transfer coefficient, has a value of zero (0). An approach is thus implemented that relates to linear programming, and analogous to the approach used in computing the delay models, so as to fit the slope model parameters. The inclusion of the slope transfer function L' in computing the transition time models increases the accuracy achievable using this approach, e.g., compared with conventional approaches. For example, for some drivers (e.g. inverters) the slope at the input of the driver affects the slope at the output. Failure to capture this effect leads to less accurate delay models.

Example implementations thus relate to a method for estimating the transition time, or slope delay to particular fanouts of particular delay stages using a parameterized delay model. The method is computed using the transition time dependent parameters.

The method computes aggregated delay stages (where the aggregation of the Utrees does not appreciably expand the size of the delay model). Example implementations also relate to a method of determining the parameter values for the delay model.

An example implementation relates to methods for estimating signal related delays and slope related delays in the design of the PLD model 400 and computation of Equation 1 and Equation 2, above, and includes modeling the design thereof as described with reference to FIG. 4, FIG. 5, FIG. 6, FIG. 7, FIG. 8, FIG. 9, and/or FIG. 10, below.

Example Methods

FIG. 5 depicts a flowchart of an example method 500 for modeling a PLD. The method 500 relates to determining values for a set of parameters related to one or more delay models of a PLD design (e.g., example PLD 100, PLD 300, PLD model 400; FIG. 1, FIG. 3, FIG. 4A-4B, respectively), according to an example implementation.

In step 510, a PLD design is modeled in relation to one or more stages, the stages respectively comprising a driver and one or more receivers coupled to the driver with a wiring tree. The modeling based on a selected set of parameters comprising: one or more slope related delays associated with the driver; a delay related to a layout of the wiring tree; and a parameter related to a slope transfer from a previous driver input, the previous driver upstream from the driver sequentially in relation, ordinal, to the one or more stages. In step 518, the wiring tree includes one or more programmable switches, and the plurality of parameters include parameters related to each of the one or more programmable switches. It is to be noted, that the programmable switches add capacitive loading to the stages.

The plurality of parameters refers to each term in the summations over s,j (K,R,X for Equation 1 and K',R,X for Equation 2).

In an example implementation shown in optional block 511 the slope related delays associated with the driver include an arc delay having a fixed duration, and/or a delay with a duration dependent on a slope of a transition time of the driver.

In an example implementation shown in optional block 512 the slope related delays associated with the driver include a slope-dependent driver transition time delay that is a sum of a linear component constrained to a value greater than or equal to zero, and a quadratic component constrained to a value less than or equal to zero.

In an example implementation shown in optional block 513 the delay related to a layout of the wiring tree relates to a fanout of the stages from the driver to the receivers.

In an example implementation shown in optional block 514 the plurality of parameters related to the switches that adds capacitive loading to the stages include: a capacitance factor corresponding to the switches in an 'on' state; and a resistance factor corresponding to a path that includes the 'on' stage switches and one of the receivers.

Further, in an example implementation shown in optional block 515 the modeling includes aggregating a first one of the stages into an aggregated stage and at optional block 516 the at least second stage includes a fixed load.

In a step 520, a predetermined set of values is accessed for the selected parameters of the modeled stages from a first computer readable storage medium.

In a step 530, the estimated signal related delays are computed for the modeled stages based on a sum of the corresponding accessed selected parameter values.

In a step 540, the computed estimated signal related delays for the modeled stages are written to a second computer-readable storage medium, optionally as one or more configuration files.

In an optional step 550, code of a design tool is executed by one or more processors, the code operable to utilize the computed estimated signal related delays for the modeled stages to estimate the signal related delays.

FIG. 6 depicts a flowchart of an example method for estimating a delay related to a PLD model. The method 600 relates to determining values for a set of parameters related to one or more delay models of a PLD design, such as the example PLD 100, according to an example implementation.

In step 610, a first data set and a second data set are populated, each data set comprises distinct, and independent data corresponding to a plurality of target parameters, wherein the PLD design is modeled in accordance with steps 510, 520, 530 and 540 (and optionally steps 511-516) of method 500 of FIG. 5.

Optionally, in step 610, the populating includes reading one or more configuration files that indicate how the plurality of target parameters are to be generated, the configuration files including computed estimated signal delays for each stages of a model.

In a step 620, a first simulation of a circuit corresponding to the modeled PLD design is computed based on the first data set, in which a corresponding first set of target parameters is fitted. In one optional example, upon the computation of the first simulation of the circuit, the corresponding first set of values related to the target parameters is fitted based on an absolute value of one or more computed prediction errors. In one example the fitting includes reducing a maximum of the absolute value of one or more computed prediction errors until a lowest reduced value is obtained. In this example, the code/data written to the computer readable storage medium in step 699 includes the one or more resulting delays related to the driver.

For example, the target parameters are fit using the observations in the data set. Each observation consists of chosen independent variables and a measured delay (from SPICE simulation). That is, each observation corresponds to a spice-simulated delay through a circuit from a driver to a receiver. The observation includes the measured delay and the independent variable values (e.g. on-switches and wire layout). Linear programming is used to fit the target parameters by minimizing the maximum delay prediction error in the data set. For example, errors are differences between SPICE simulated delay and the respective predicted delay from Equation 1.

In one optional example, the values saved at 699 are saved as code 662 and when executed estimate signal related delays corresponding to the saved first and second set of values.

In one optional example, each of the stages includes at least one fanout. Each of the fanouts spans from the driver of the stage to one of the receivers thereof, which is coupled to the driver with the wiring tree thereof that includes the driver and the receiver.

FIG. 7 depicts a flowchart of an example method for computing a first circuit simulation. FIG. 7 thus represents other (e.g., optional) details related to the step 620 of FIG. 6.

These aspects of the step 620 are described below, with reference to detail blocks 722 through 727.

In the example of FIG. 7, as shown by block 722 recording a pair of slope related delays associated with the driver, in which each of the set of stages includes at least one fanout, each of at least one fanout spanning from the driver of the set of stages to one or more receivers thereof, and coupled to the driver with the wiring tree thereof between the driver and the receiver, and an active path in the at least one fanout from the driver to the receiver includes at least one switch in a conductive 'on' state.

In block 723, optionally, a set of data points from a first saved set of values related to one or more delays related to the driver is selected.

In a block 724, each of a recorded pair of slope related delays associated with the driver is inserted into one of the selected set of data points.

In a block 725, a delay related to a layout of a wiring tree and parameters related to each of a set of switches that adds capacitive loading to each of a set of stages are fit, wherein a maximum of an absolute value of one or more computed prediction errors is minimized.

In a block 726, corresponding values for the delay related to the layout of the wiring tree and the parameters related to each of the set of switches that adds capacitive loading to each of the set of stages are computed.

In a block 727, the computed corresponding values for the delay related to a layout of the wiring tree and the parameters related to each of the set of switches that adds capacitive loading to each of the set of stages are recorded, in which the recorded pair of the slope related delays associated with the driver, and the recording values for the delay related to the layout of the wiring tree and the parameters related to each of the set of switches that adds capacitive loading to each of the set of stages are written to a computer readable storage medium.

In step 630, a second simulation of the circuit corresponding to the modeled PLD design is computed based on the second data set wherein a corresponding second set of values related to a plurality of guard bands are defined.

Optionally, in step 630, the second set of values related to the plurality of guard bands includes a broad array of varying independent variables related to which of the programmable switches are in a conductive state, which of the one or more stages drives a stage under test, and which of one or more physical layouts of the PLD correspond to the stages, there being no overlap between the first data set and the second data set.

FIG. 8 depicts a flowchart of an example for computing a second circuit simulation. FIG. 8 thus represents other (e.g., optional) aspects of the step 630 (FIG. 6) described below.

In a block 831, one or more of an allowable rate (R) of one or more underestimates related to set-up times, or one or more overestimates related to hold times for each of a set of delay models, are determined, and one or more delay prediction errors for each of a second set of values in a second data set are generated.

In a block 832, each of the generated one or more delay prediction errors (e') are ordered from a smallest ordinal value thereof to a largest value thereof, and delayed prediction errors are selected having a rising signal when the input of the device, or stage, within the PLD has a rising signal or delayed prediction errors having a falling signal when the PLD has a falling signal. In relation to the set-up times, the one or more delay prediction errors (e') is computed such that the one or more allowable rate (R) includes a fraction of the generated delay prediction errors with an ordinal value smaller than the computed delay prediction error, in which the guard band is set to the value 'e' and in relation to the hold times, the delay prediction error 'e' is computed such that the allowable rate R includes a fraction of the generated delay prediction errors with an ordinal value larger than the computed delay prediction error, in which the guard band is value 'e'.

In a block 833, optionally, a plurality of guard bands includes a first guard band including an estimate of at least one set-up time when the PLD has a rising output signal, a second guard band that includes an estimate of at least one set-up time when the PLD has a falling output signal, a third guard band that includes an estimate of at least one hold time when the PLD has a rising output signal, and a fourth guard band that includes an estimate of at least one hold time when the PLD has a falling output signal.

Referring back to FIG. 6, in a step 638 values identified in the first simulation and values identified in the second simulation are saved to a computer-readable storage medium.

Referring back to FIG. 6, in a step 640, it is determined whether the slope transfer coefficient for the current stage is equal to zero. If the slope transfer coefficient L' for the current stage is equal to zero (L'=0), then the method 600 termination is achieved at a step 699, and values identified in the first simulation and values identified in the second simulation and values identified in a recursive routine, to be discussed below, are saved to a computer-readable storage medium.

Optionally, at 662 values are save as code and executed to estimate signal related delays corresponding to the saved first and second set of values.

If however it is determined in step 640 that the slope transfer coefficient for the current stage is not equal to zero (L' 0), then a step 650 is performed. In the step 650, the slope at the beginning of the current stage is estimated, based on the slope of the stage ordinally previous thereto, prior to estimating the slope at the end of the current stage. The method 600 then loops back and re-performs the step 640, until the slope transfer coefficient L' for the current stage equals zero (0), and is thus a recursive routine.

In one optional example 660, for the current stage in which L' 0, a recursive routine is executed, which traces L' through multiple ordinal previous stages to estimate slope of the current stage until L'=0. That is, the recursive routing persists until the value estimated for the current stage is equal to zero (0).

Figure 9:
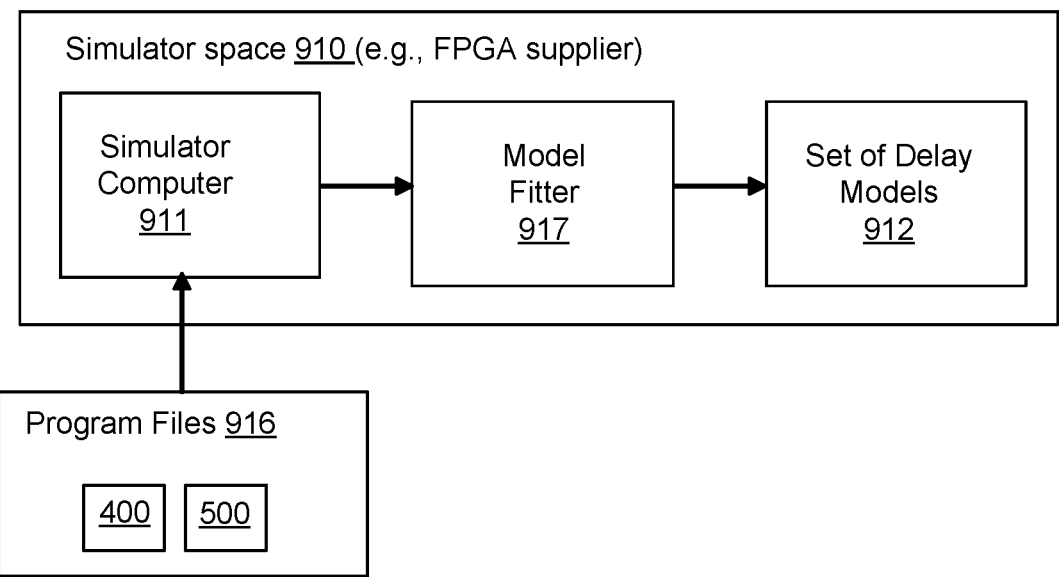
FIG. 9 depicts an example simulator space tool chain.

In an example implementation, the method 500 and 600, respectively described with reference to FIG. 5 and FIG. 6, and the steps and blocks thereof described with reference to FIG. 7, FIG. 8 and FIG. 9 are executed by one or more computer systems. In example implementations, the data computed in relation of these methods is implemented across a tool chain for designing PLDs.

Example Tool Chain and Computer System

FIG. 9 depicts an example tool chain 900 for simulation of PLDs, including FPGAs (and/or other ICs) delay models. The tool chain 900 includes a simulator space 910. Generally, the simulator space 910 is deployed with the supplier, manufacturer, designer or vendor of the subject PLD. A designer space 1030 (in FIG. 10), on the other hand, is generally deployed with an end (or midstream) user of the PLDs.

The simulator space 910 includes a simulator computer 911, which is operable for executing and/or performing an IC simulation program such as SPICE, and has access to all relevant databases, circuit netlists, and product data relevant to designing the subject PLDs. Moreover, the simulator computer (and/or computers operable with the data generated therewith) are operable based on a set of program files 916, which are encoded tangibly on a computer readable storage medium operable with the simulator computer 911.

In example implementations, the program files 916 include data, which when executed and/or performed by one or more processors of the simulator computer 911 cause the execution, performance and/or or control of one or more of the method 500 or the method 600 (FIG. 5, FIG. 6; respectively). 917 is a model fitter downstream from the SPICE simulations. In an example implementation, the simulator computer outputs a set of delay models 912. Thus, the simulator computer 911 computes, model fitter 917 fits, and simulator computer 911 stores a set of delay models 912, e.g., for the PLD 100 (FIG. 1), based (at least in part) on the method 500 and/or the method 600.

Figure 10:
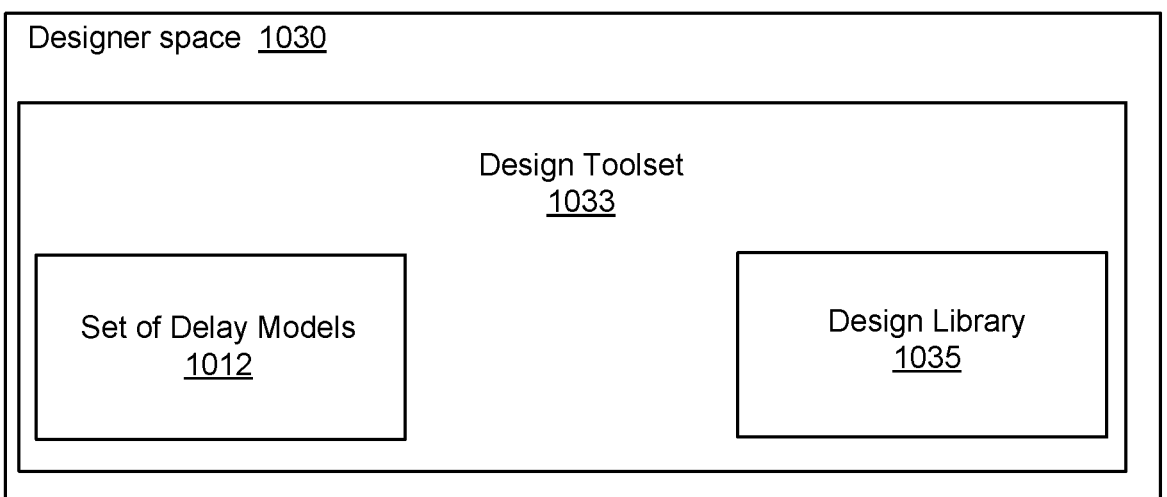
FIG. 10 depicts an example user designer space.

FIG. 10 depicts an example of a tool chain 1000 having a designer space 1030 which includes the design toolset 1033. The set of delay models 1012 are included in a design toolset 1030. The delay models 1012 are derived from, or are the same as, the set of delay models 912 in FIG. 9. The design toolset 1033 is operable in relation to preparing a user design implemented on a PLD such as an FPGA.

The design toolset 1033 also includes a design library 1035 of predesigned circuit designs related to a selection (e.g., catalog) of PLDs. The design library 1035 optionally has information related to the operational frequency of the predesigned circuit designs.

An example implementation relates to methods (e.g., 500, 600; FIG. 5, FIG. 6, respectively) for producing a set of delay models 912 for the circuit elements on the PLD (e.g., 100; FIG. 1), and allow deployment of the delay models 912 in design toolsets 1033 for PLDs as set of delay models 1012.

An example implementation relates to processes for analyzing circuit timing functionality across the tool chain 1000. Design toolset 1033 based on the example implementations described herein allow users to effectively and efficiently compute speeds at which their circuit designs are accurately expected to perform on the PLDs they design therewith.

While the set of delay models 912 themselves are generally not used directly in programming PLD devices (e.g., PLD 100; FIG. 1) to run a user's design, they allow a given bit stream set to be loaded into a PLD to program and run the exact same, and/or amended and revised variants of the particular user design. Thus, while the parametric delay models and their parameters are not directly disposed on the PLD so as to physically configure the programmable elements thereof, they are deployed in the design toolset 1033, with which they are programmably configured.

Conventional design toolsets with various delay model sets generally generate different predictions, based on the frequency at which the user's design is run. Unfortunately, the inaccuracy of delay models generated using conventional techniques demands the use of excessive guard bands to be conservative. Such excessive guard bands increase the delay estimate, generally rendering delay estimates that are excessively conservative in view of the actual capability of the PLD, and thus needlessly constrain the predicted operating frequency in an effort to ensure that a user design is at least functionally correct and operable.

Therefore, although the PLD 100 can run the user's design at higher frequencies, conventional toolsets generally predict a lower operating frequency. This constrains the user to setting up a clock frequency for the PLD 100 according to the lower frequency prediction generated by the toolset. When the PLD 100 is ultimately programmed based on configuration data so constrained, its operable performance (e.g., speed) is likely thus less than (e.g., slower than) that, which the PLD is actually capable of achieving if not so constrained.

Example implementations described herein provide a method of modeling delays in designs of a PLD, which allows a design toolset 1033 to model on-the-silicon operating frequency of the PLD with greater accuracy. Set of delay models 912 and 1012 implemented according to the disclosure herein provide a more exact reflection of the true operational capabilities of the PLD, as eventually configured in the silicon (or other semiconductor) on which the PLD is disposed.

As denoted by their names, PLDs are programmable integrated circuit (IC) devices and thus allow connection of their circuit elements, based on programmed configuration data, in a variety of ways to enable various user design functionality, design performance, and operating frequency. In view of the flexibility and variability of the PLDs, the design toolset 1033 implemented based on the present disclosure allows users to design using set of delay models 1012. Notwithstanding how the circuit elements on the PLD 100 are connected, example implementations allow the same set of delay models 912 and 1012 to compute a prediction of the performance of each of the user's proposed designs.

As there are many ways to connect the circuit elements of a PLD, exhaustively enumerating all the possible connection pathways becomes impracticable. In example implementations, a limited first set of connection approaches are distilled into a first data set. The first data set connects circuit elements and collects data points on those cases to fit a corresponding set of parametric delay models.

The delay models are refined with a second set of connection approaches different than the first set of connection approaches, which are distilled into a second data set. The first data set and the second data set connect circuit elements and collects data points on those cases to fit a corresponding set of parametric delay models.

The first data set and the second data set generally have no overlapping test cases and are independent of each other because overlapping test cases do not give new information.

In an example implementation, the delay models are verified by using a validation set. The validation set is independent of the first and second data sets. The validation set verifies the accuracy of the parametric delay models, and verifies that these delay models cover many possible ways of connecting circuit elements with acceptable accuracy.

Example implementations allow PLD users to design PLDs such as FPGAs "in the field" with increased accuracy, relative to contemporary, current conventional approaches to programming processes. The example implementations obviate many of the additional excessive guard bands associated therewith. Example implementations thus increase the performance of field programmers' PLD designs, e.g., in comparison to conventional programming approaches that generally use the additional guard bands.

It should be appreciated that the flowcharts related to the methods 500 and 600 (FIG. 5; FIG. 6, respectively), and the more detailed flow diagrams depicted in FIG. 7 through FIG. 8, inclusive, depict architecture, functionality, and operation of various implementations of methods, computer program products and related tangible computer readable media and computer systems, according to various implementations described in the present disclosure. In relation therefore, each block and/or step in the flowcharts herein represents a portion or segment of code, included in one or more portions of computer-usable program code, which implements one or more of the logical functions described in relation to the flowcharts.

The methods and media described herein are implemented in hardware, software, or a combination of hardware and software. These methods and media are implemented, alternatively, in a centralized fashion in one computer system, or in a distributed fashion, in which different elements are spread across several interconnected computer systems.

While any kind of computer system or other apparatus adapted for carrying out the methods described herein is suitable, an example implementation is disposed, deployed or programmed on a dedicated computer system platform, specialized for performing the computations described herein. In an example implementation, a combination of hardware and software includes a general-purpose computer system with a computer program. Upon loading, execution and performance therewith, the program controls the computer system such that it carries out the methods described in the present disclosure, as a special purpose device.

Example implementations are also encoded and/or embedded in a computer program product and/or related tangible computer readable storage media. These implementations include all the features enabling the implementation of the methods described herein and which, when loaded in a computer system, are able to carry out these methods and related processes, and to program, configure, direct and control the computer system to perform these methods and related processes.

As used herein, the term "software" refers or relates to any expression, in any language, including but not limited to Hardware Descriptive Language (HDL), a related language, or another language, code or notation, and/or a set of encoded instructions therein, which has the effect of causing a system having an information processing capability to perform a particular function either directly or, upon conversion to another language, code or notation, or reproduction in a different material form. For example, software programs implemented according to the disclosure herein include, but are not limited to, a subroutine, a function, a procedure, an object method, an object implementation, an executable application, an applet, a servlet, a source code, an object code, a shared library/dynamic load library, relational and other database queries and related searches and replies, and instructions, and/or other sequences of instructions and related data designed for execution on the computers described herein.

In example implementations, such software runs (e.g., is read, executed and operably active and operationally functional) in a simulator space and/or a designer space, and on various computer systems, as described with reference to FIG. 9 and FIG. 10, below.

Figure 11:
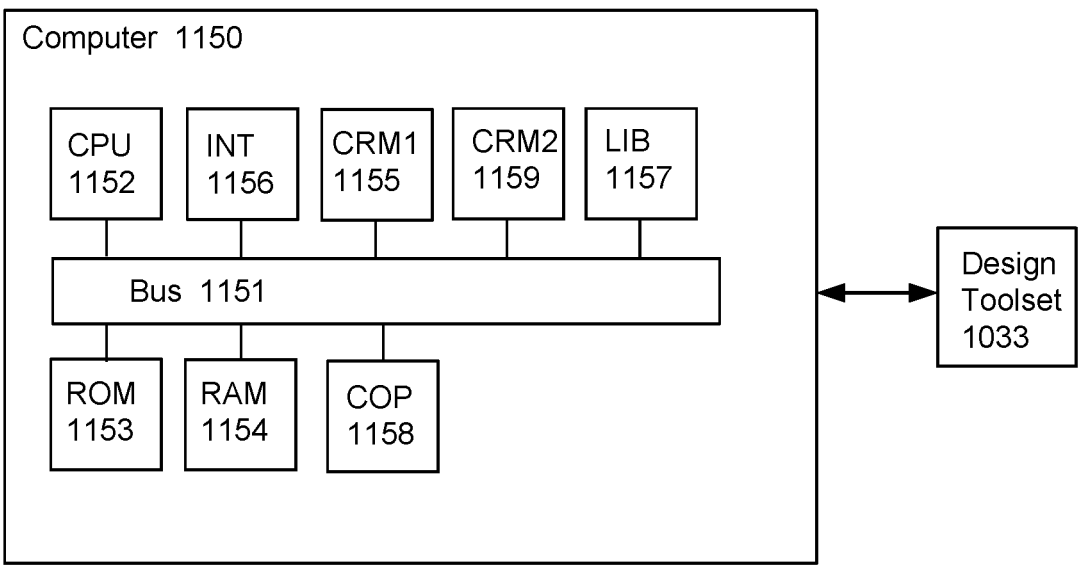
FIG. 11 depicts an example computer system.

FIG. 11 depicts an example computer system 1150, which in is operable with the design toolset 1033. The computer 1150 has a bus 1151. One or more processors are coupled to the bus 1151. For example, the computer 1150 has a central processing unit (CPU) 1152. The CPU 1152 performs general processing operations related to the operation of the computer 1150, based in part on code such as a basic input/output system (BIOS) stored in a read-only memory (ROM) 1153, to which the CPU 1152 is coupled through the bus 1151.

During performance of its computations, the CPU 1152 is operable for reading data from, and writing data to a random access memory (RAM) 1154. In an example implementation, the RAM 1154 represents one or more memory related components, each operable as computer readable storage media (CRM) with the CPU 1152 and/or one or more other processors, as described below.

In an example implementation, at least one coprocessor (COP) 1158, such as a mathematics ('Math') coprocessor and/or graphics processing unit (GPU), is coupled to the bus 1151 and operable with the RAM 1154 and/or program code stored on a computer readable storage medium (CRM1) 1155, which is also coupled to the bus 1151. In one example implementation there is as second computer readable storage medium (CRM2) 1159, which is also coupled to the bus 1151.

In an example implementation, the program code stored on the CRM1 1155 also allows the computer 1150 to operate with the design toolset 1033. In an example implementation, an instance of the design toolset 1033 is stored on the CRM1 1155, with a specialized library 1157 (also coupled to the bus 1151), and/or in independent media included within the computer 1150.

The computer 1150 has one or more interfaces 1156 coupled to the bus 1151. The interfaces 1156 are operable for communicatively coupling the computer 1150 to one or more peripherals used by the designer, including (but not limited to) a display, mouse, keyboard, external storage, and/or one or more communications networks.

The simplified models and methods of various example implementations and described with reference to, and Equation 1 and Equation 2, above, are thus computed using a limited, amount of data and this lessens the amount of data used to fit the parameters of the delay models data, and improves the speed with which the delay estimates are computed. Moreover, the example implementations avoid errors in undesired directions by, for example, avoiding underestimates for setup timing.

As described above, each of the stages of the PLD design includes a driver and one or more receivers coupled to the driver with a wiring tree. The wiring tree includes none, or one or more programmable switches. The modeling is based on the predetermined models and delay estimates 1033 as a selected set of parameters, which were pre-computed by the simulator computer 910. The selected set of the parameters includes one or more slope related delays associated with the driver, a delay related to a layout of the wiring tree, a plurality of parameters related to each of the switches, if any, that adds capacitive loading to each of the stages, and a parameter related to a slope transfer from a previous driver input, the previous driver upstream from the driver sequentially in relation, ordinally, to the one or more stages.

For clarity and brevity, as well as to avoid unnecessary or unhelpful obfuscating, obscuring, obstructing, or occluding features or elements of an example of the disclosure, certain intricacies and details, which are known generally to artisans of ordinary skill in related technologies, have been omitted or discussed in less than exhaustive detail. Any such omissions or discussions are unnecessary for describing examples of the disclosure, and/or not particularly relevant to an understanding of significant features, functions and aspects of the examples of the disclosure described herein.

The term "or" is used herein in an inclusive, and not exclusory sense (unless stated expressly to the contrary in a particular instance), and use of the term "and/or" herein includes any and all combinations of one or more of the associated listed items, which are conjoined/disjoined therewith. Within the present description, the term "include," and its plural form "includes" (and/or, in some contexts the term "have," and its conjugate "has") are respectively used in same sense as the terms "comprise" and "comprises" are used in the claims set forth below, any amendments thereto that are potentially presentable, and their equivalents and alternatives, and/or are thus intended to be understood as essentially synonymous therewith. The figures are schematic, diagrammatic, symbolic and/or flow-related representations and so, are not necessarily drawn to scale unless expressly noted to the contrary herein. Unless otherwise noted explicitly to the contrary in relation to any particular usage, specific terms used herein are intended to be understood as in a generic and/or descriptive sense, and not for any purpose of limitation.

An example implementation is thus described in relation to a method for estimating signal related delays in the design implement on a PLD, such as a FPGA, and a system operable based on the method. The method includes modeling the PLD design in relation to one or more stages. Each of the stages has a driver and one or more receivers coupled to the driver with a wiring tree. The wiring tree includes none, or one or more programmable switches. The modeling is based on a selected set of parameters, which include one or more slope related delays associated with the driver, a delay related to a layout of the wiring tree, a plurality of parameters related to each of the switches that adds capacitive loading to each of the stages, and a parameter related to a slope transfer from a previous driver input, the previous driver upstream from the driver sequentially in relation, ordinally, to the two or more stages.

A predetermined set of values is accessed for each of the selected parameters of each of the modeled stages from a first computer readable storage medium. The estimated signal related delays are computed for each of the modeled stages based on a sum of the corresponding accessed selected parameter values. The computed estimated signal related delays for each of the modeled stages is written to a second computer-readable storage medium as code, which when executed by one or more processors is operable for estimating signal related delays in the user's design slated for programming into a PLD.

In the specification and figures herein, examples implementations are thus described in relation to the claims set forth below. The present disclosure is not limited to such examples however, and the specification and figures herein are thus intended to enlighten artisans of ordinary skill in technologies related to integrated circuits in relation to appreciation, apprehension and suggestion of alternatives and equivalents thereto.

What is claimed, is:

1. A method for estimating signal related delays in a programmable logic device (PLD) design, the method comprising:

modeling the PLD design in relation to one or more stages, the stages respectively comprising a driver and one or more receivers coupled to the driver with a wiring tree, the modeling based on a selected set of parameters comprising:

one or more slope related delays associated with the driver;

a delay related to a layout of the wiring tree; and a parameter related to a slope transfer from a previous driver input, the previous driver upstream from the driver sequentially in relation, ordinal, to the one or more stages;

accessing a predetermined set of values for the selected parameters of the modeled stages from a first computer readable storage medium;

computing the estimated signal related delays for the modeled stages based on a sum of the corresponding accessed selected parameter values; and writing the computed estimated signal related delays for the modeled stages in a second computer-readable storage medium.

2. The method of claim 1, wherein the wiring tree comprises one or more programmable switches, and wherein the selected set of parameters comprise parameters related to the one or more programmable switches.

3. The method of claim 2 wherein the computed estimated signal related delays for the modeled stages is written as one or more configuration files.

4. The method of claim 2 wherein the selected set of parameters comprise parameters related to the one or more programmable switches:

a capacitance factor corresponding to the one or more programmable switches in an 'on' state; and a resistance factor corresponding to a path that includes the 'on' state programmable switches and one of the receivers.

5. The method of claim 1 wherein the computed estimated signal related delays for the modeled stages is written as one or more configuration files.

6. The method of claim 1 wherein the one or more slope related delays associated with the driver include an arc delay having a fixed duration, or a delay with a duration dependent on a slope of a transition time of the driver.

7. The method of claim 6 wherein the one or more slope related delays associated with the driver include a slope-dependent driver transition time delay that is a sum of a linear component constrained to a value greater than or equal to zero, and a quadratic component constrained to a value less than or equal to zero.

8. The method of claim 1 wherein the delay related to a layout of the wiring tree relates to a fanout of the respective stages from the driver to each of the one or more receivers.

9. The method of claim 1 wherein the modeling the PLD design includes aggregating a first one of the stages with a second stage into an aggregated stage.

10. The method of claim 9 wherein the second stage includes a fixed load.

11. A method of determining values for a set of parameters related to one or more delay models of a programmable logic device (PLD) design, the method comprising:

populating a first data set and a second data set, the first data set and the second data set comprising distinct independent data corresponding to a plurality of target parameters, wherein the PLD design is modeled in relation to one or more stages, the one or more stages respectively comprising a driver and one or more receivers coupled to the driver with a wiring tree, and wherein the plurality of target parameters comprise:

one or more slope related delays associated with the driver;

a delay related to a layout of the wiring tree; and a parameter related to a slope transfer from a previous driver input, the previous driver upstream from the driver sequentially in relation, ordinal, to the one or more stages;

computing a first simulation of a circuit corresponding to the modeled PLD design based on the first data set wherein a corresponding first set of target parameters is fitted;

computing a second simulation of the circuit corresponding to the modeled PLD design based on the second data set wherein a corresponding second set of values related to a plurality of guard bands are defined; and saving values identified in the first simulation and values identified in the second simulation to a computer-readable storage medium.

12. The method of claim 11, wherein the wiring tree comprises one or more programmable switches, and wherein the selected set of parameters comprise parameters related to the one or more programmable switches.

13. The method of claim 11 comprising:

(a) determining if the slope transfer parameter of the current stage equals zero; and when the slope transfer parameter of the current stage equals zero, saving values identified in the first simulation and values identified in the second simulation and values identified in a recursive routine to a computer-readable storage medium;

when the slope transfer parameter of the current stage does not equal zero, estimating a slope at a beginning of the current stage before estimating the slope at the end of the current stage and then returning to (a).

14. The method of claim 13 wherein the saved first and second set of values are written to the computer-readable storage medium as code, which when executed by one or more processors are operable for estimating the signal related delays corresponding to the saved first and second set of values upon accessing and executing the code.

15. The method of claim 13 comprising saving the values identified in the first simulation and the values identified in the second simulation as code and execute to estimate signal related delays corresponding to the saved first and second set of values.

16. The method of claim 13 comprising when the slope transfer parameter of the current stage does not equal zero, then for the current stage in which the slope transfer parameter does not equal zero, estimating slope at a beginning of the current stage before estimating the slope at the end of the current stage, and executing a recursive routine which traces the slope transfer parameter through multiple ordinal previous stages to estimate slope of the current stage until the slope transfer parameter equals zero, then returning to (a).

\* \* \* \* \*